(12) United States Patent
Little et al.

(10) Patent No.: US 9,502,821 B2
(45) Date of Patent: *Nov. 22, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Chih-Hsien Chou, San Jose, CA (US); Shuo-Hsiu Hsu, New Taipei (TW); Chih-Kai Yang, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/591,927

(22) Filed: Jan. 8, 2015

(65) Prior Publication Data

US 2015/0194770 A1 Jul. 9, 2015

Related U.S. Application Data

(63) Continuation-in-part of application No. 14/497,205, filed on Sep. 25, 2014, which is a continuation-in-part
(Continued)

(30) Foreign Application Priority Data

Jan. 23, 2014 (CN) ...................... 2014 2 0042294 U

(51) Int. Cl.
*H01R 13/627* (2006.01)
*H01R 13/6582* (2011.01)
(Continued)

(52) U.S. Cl.
CPC ...... *H01R 13/6273* (2013.01); *H01R 13/6582* (2013.01); *H01R 13/6587* (2013.01);
(Continued)

(58) Field of Classification Search
CPC .......... H01R 13/6587; H01R 13/6273; H01R 13/6593; H01R 13/6592; H01R 13/6594

USPC ........ 439/660, 607.1, 607.4, 607.05, 607.13, 439/607.12, 607.15, 607.35, 607.36, 487, 439/485

See application file for complete search history.

(56) References Cited

U.S. PATENT DOCUMENTS

| | | | |
|---|---|---|---|
| 5,073,130 A | 12/1991 | Nakamura | |
| 6,074,225 A * | 6/2000 | Wu | H01R 23/6873 439/101 |

(Continued)

FOREIGN PATENT DOCUMENTS

| | | |
|---|---|---|
| CM | CN201868687 U | 6/2011 |
| CN | 201029143 Y | 2/2008 |

(Continued)

OTHER PUBLICATIONS

USB Type-C Specification 0.9c05-20140518.
(Continued)

*Primary Examiner* — Tulsidas C Patel
*Assistant Examiner* — Marcus Harcum
(74) *Attorney, Agent, or Firm* — Wei Te Chung; Ming Chieh Chang

(57) ABSTRACT

An electrical connector includes an insulative housing defining a forwardly extending mating tongue, a plurality of contacts with contacting sections exposed upon the mating tongue and a metallic shield enclosing the insulative housing to define a mating cavity. A metallic shielding plate is embedded within the mating tongue and forms a pair of locking notches in two opposite lateral sides. The mating tongue further includes in two opposite lateral sides a pair of recesses aligned with and intimately located inside of the pair of locking notches, respectively, in the transverse direction. The housing and the corresponding contacts commonly form the terminal module which is composed of an upper terminal module, a lower terminal module commonly sandwiching a shielding plate module therebetween in the vertical direction. The metallic shield optionally defines a clip structure by folding an extension on a rear lower edge thereof.

20 Claims, 54 Drawing Sheets

Related U.S. Application Data of application No. 14/477,889, filed on Sep. 5, 2014, which is a continuation-in-part of application No. 14/454,737, filed on Aug. 8, 2014, which is a continuation-in-part of application No. 14/337,180, filed on Jul. 21, 2014, now Pat. No. 9,318,853.

(60) Provisional application No. 61/926,270, filed on Jan. 11, 2014, provisional application No. 61/927,951, filed on Jan. 15, 2014, provisional application No. 61/916,147, filed on Dec. 14, 2013, provisional application No. 61/919,681, filed on Dec. 20, 2013, provisional application No. 61/917,363, filed on Dec. 18, 2013, provisional application No. 61/949,232, filed on Mar. 6, 2014, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013.

(51) Int. Cl.
*H01R 24/60* (2011.01)
*H01R 13/6587* (2011.01)
*H01R 12/72* (2011.01)
*H01R 24/28* (2011.01)
*H01R 107/00* (2006.01)
*H05K 1/11* (2006.01)
*H05K 1/18* (2006.01)

(52) U.S. Cl.
CPC ............. *H01R24/60* (2013.01); *H01R 12/724* (2013.01); *H01R 24/28* (2013.01); *H01R 2107/00* (2013.01); *H05K 1/117* (2013.01); *H05K 1/184* (2013.01); *H05K 2201/10189* (2013.01)

(56) References Cited

U.S. PATENT DOCUMENTS

| | | | |
|---|---|---|---|
| 6,755,689 B2 | 6/2004 | Zhang et al. | |
| 7,758,379 B2 * | 7/2010 | Chen ................ | H01R 13/6485 439/607.11 |
| 8,038,480 B2 * | 10/2011 | Wei .................... | H01R 13/502 439/607.01 |
| 8,087,944 B2 | 1/2012 | Kumamoto et al. | |
| 8,109,795 B2 * | 2/2012 | Lin ................... | H01R 13/6461 439/660 |
| 8,517,773 B2 | 8/2013 | Lee et al. | |
| 8,684,769 B2 * | 4/2014 | Kao ................... | H01R 13/6471 439/607.28 |
| 8,708,734 B2 * | 4/2014 | Su ............................ | H01R 9/03 439/452 |
| 8,968,031 B2 * | 3/2015 | Simmel ............... | H01R 13/659 439/108 |
| 9,022,800 B2 * | 5/2015 | Yang ................... | H01R 13/6581 439/487 |
| 2010/0267261 A1 | 10/2010 | Lin et al. | |
| 2013/0095702 A1 | 4/2013 | Golko et al. | |
| 2014/0024257 A1 * | 1/2014 | Castillo ............... | H01R 13/6585 439/607.05 |
| 2014/0073184 A1 * | 3/2014 | Zhao .................. | H01R 13/6594 439/607.55 |
| 2015/0162684 A1 | 6/2015 | Amini et al. | |
| 2015/0171562 A1 | 6/2015 | Gao et al. | |
| 2015/0171573 A1 * | 6/2015 | Little ..................... | H01R 24/60 439/607.34 |
| 2015/0214673 A1 | 7/2015 | Gao et al. | |
| 2015/0214674 A1 | 7/2015 | Simmel et al. | |
| 2015/0295362 A1 | 10/2015 | Tzviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |

FOREIGN PATENT DOCUMENTS

| | | |
|---|---|---|
| CN | 201230066 Y | 4/2009 |
| CN | 101573840 A | 11/2009 |
| CN | 201623280 U | 11/2010 |
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 1.0 Aug. 11, 2014.
Universal Serial Bus Type-C Cable and Connector Specification Revision 0.7 Working Draft Jan. xx, 2014.

* cited by examiner

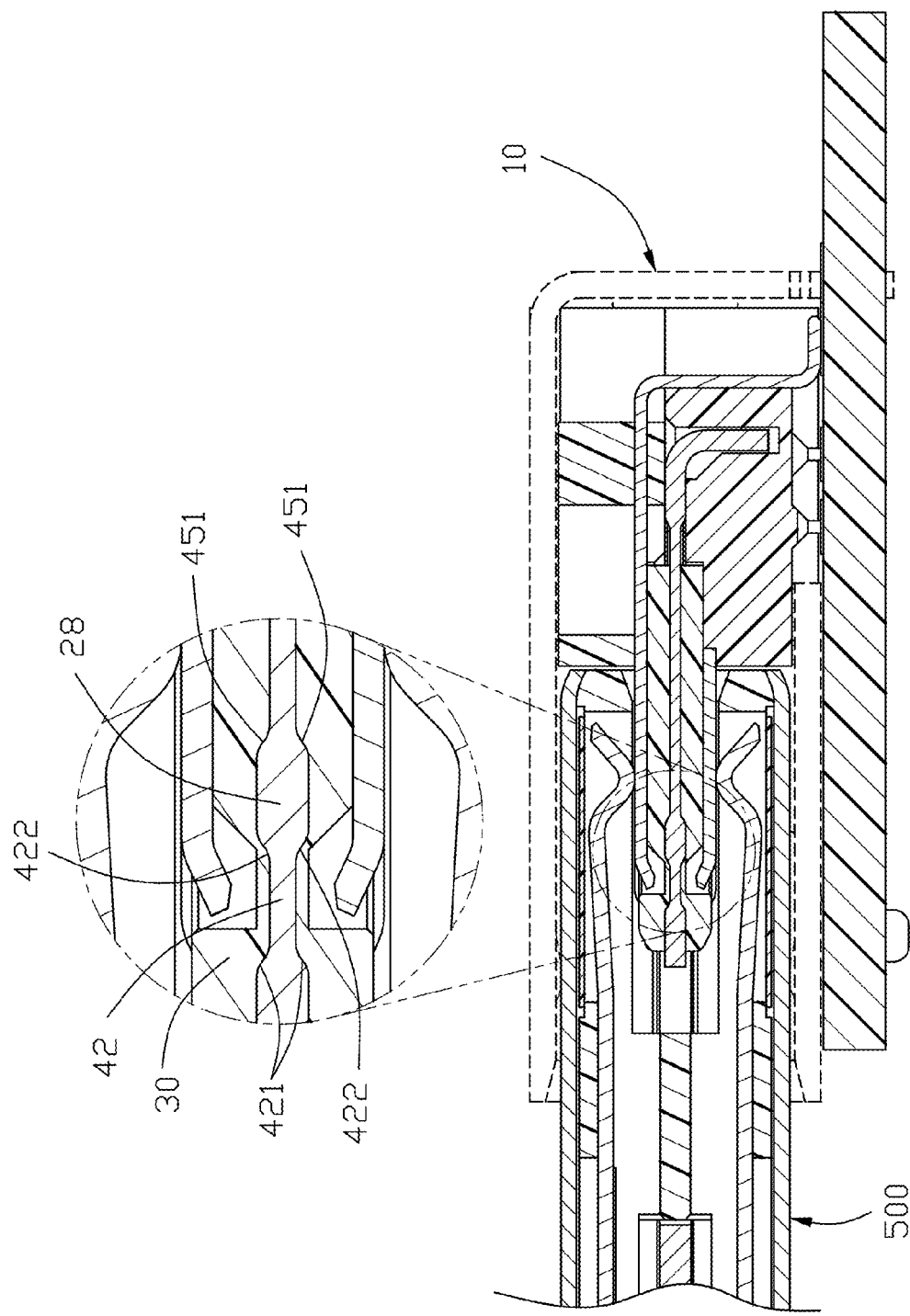

FLIPPABLE ELECTRICAL CONNECTOR

CROSS REFERENCE TO RELATED APPLICATIONS

This application is a continuation-in-part of Ser. No. 14/497,205 filed Sep. 25, 2014, and directly claims the benefit of, and priority to, U.S. Provisional Patent Application Nos. 61/926,270, filed Jan. 11, 2014, and 61/927,951 filed Jan. 15, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals.

Hence, a new and simple electrical plug connector and the complementary receptacle connector are desired.

SUMMARY OF THE INVENTION

Accordingly, the object of the present invention is to provide an electrical connector assembly comprises a first connector and a second connector intending to mate with the first electrical connector. The first electrical connector comprises an insulative housing defining a forwardly extending mating tongue, a plurality of contacts disposed in the insulative housing with contacting sections exposed upon the mating tongue and a metallic shield enclosing the insulative housing to define a mating cavity in which said mating tongue is disposed. A metallic shielding plate is embedded within the mating tongue with locking edges on two opposite lateral sides. Except the contacting sections of the contacts thereon, the mating tongue may be commonly formed by the both the upper terminal module and the lower terminal module with the shielding plate therebetween, or is directly formed by a shielding plate module which contain the insulator with the embedded shielding plate via the insertion molding process. The common basic structure of the invention applying to all the embodiment in this invention, is to use the three-piece or sandwiched type terminal assembly enclosed within the shield. The shielding plate includes a pair of locking notches on two opposite lateral sides. The shielding plate may be equipped with a recessed or empty area so as to form a restriction part with regard to the insert molded insulator of the mating tongue. The metallic shield further optionally defines a clip structure by folding an extension on a rear lower edge of the metallic shield. The second electrical connector comprising: an insulative housing defining a receiving cavity to receive the mating tongue, a plurality of contacts disposed in the insulative housing with contacting sections exposed in the receiving cavity and a metallic shell snugly attached on an outer periphery of the insulating housing. The second electrical connector further includes a latch with a pair of locking heads to lock to the corresponding locking notches of the shielding plate of the first connector respectively during mating. The insulative housing of the second electrical connector defines a recess in a front end to expose the metallic shell of the second connector therein so that during mating, the metallic shell of the second connector in the recess is optionally sandwiched by the clip structure of the first electrical connector.

Other objects, advantages and novel features of the invention will become more apparent from the following detailed description when taken in conjunction with the accompanying drawings.

BRIEF DESCRIPTION OF THE DRAWINGS

FIG. 13 is a cross-sectional view of the receptacle connector of FIG. 1 mated with a plug connector having a bull-nose configuration thereof.

DETAILED DESCRIPTION OF THE PREFERRED EMBODIMENT

Figure 1:
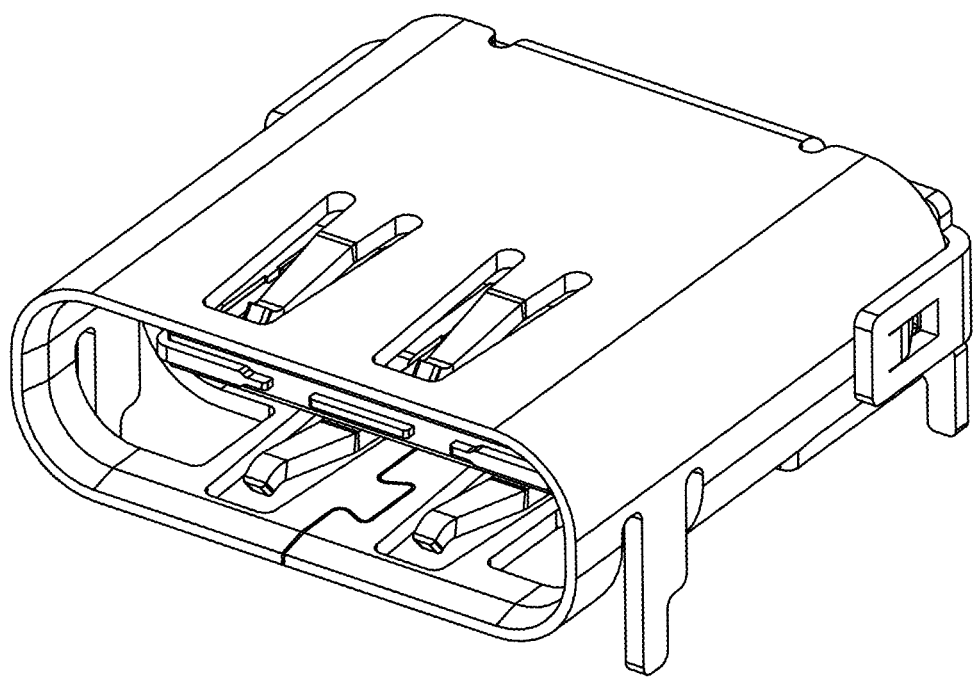
FIG. 1 is a front perspective view of a receptacle connector according to an embodiment of the instant invention.
Figure 2:
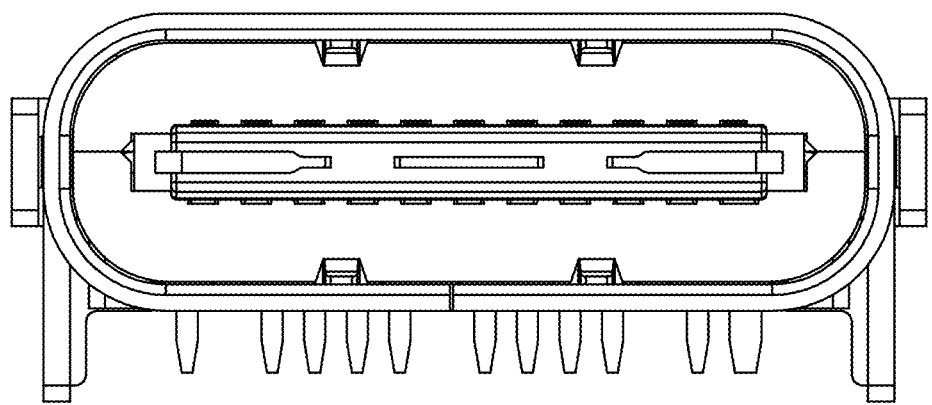
FIG. 2 is a front elevational view of the receptacle connector of FIG. 1.
Figure 3A:
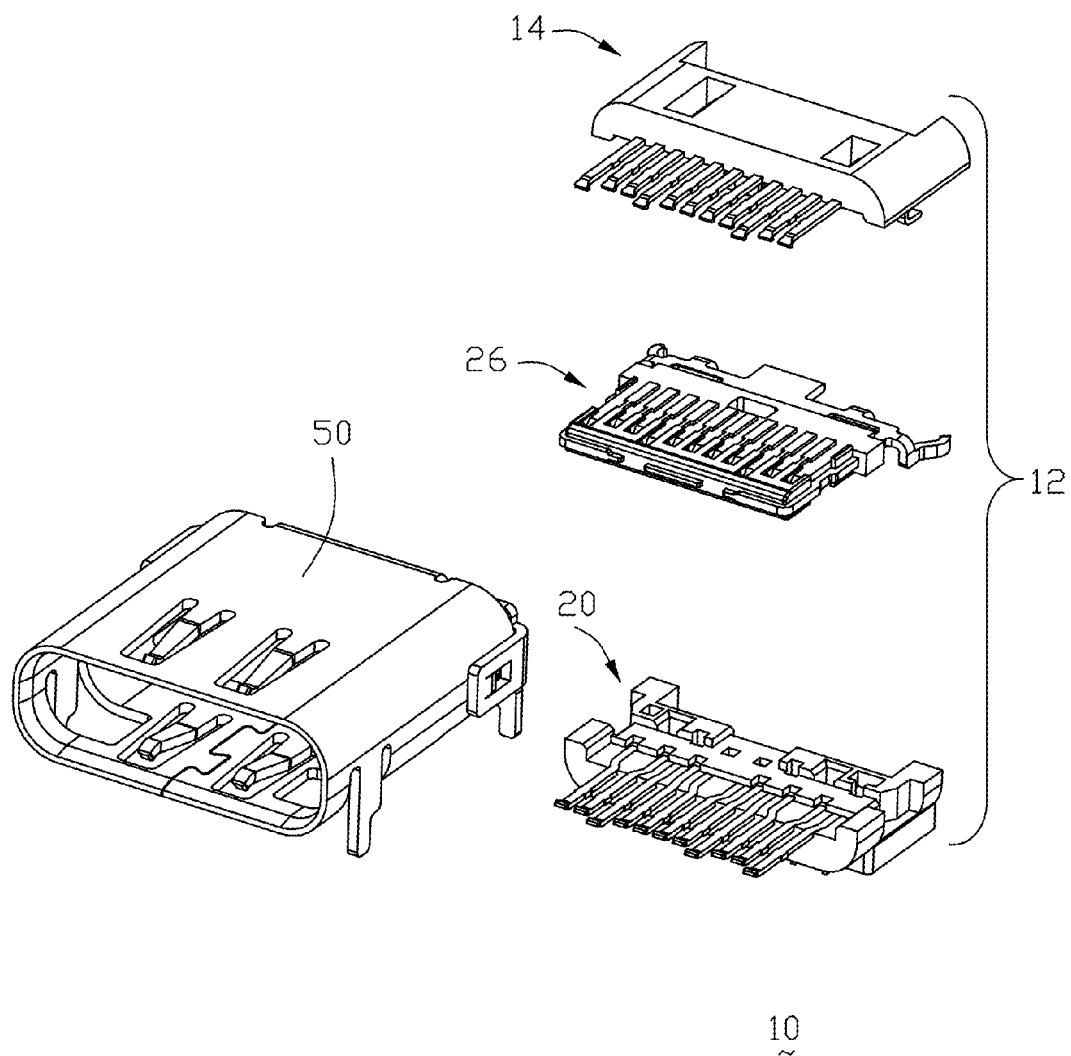
FIG. 3(A) is a front exploded perspective view of the receptacle connector of FIG. 1.
Figure 3B:
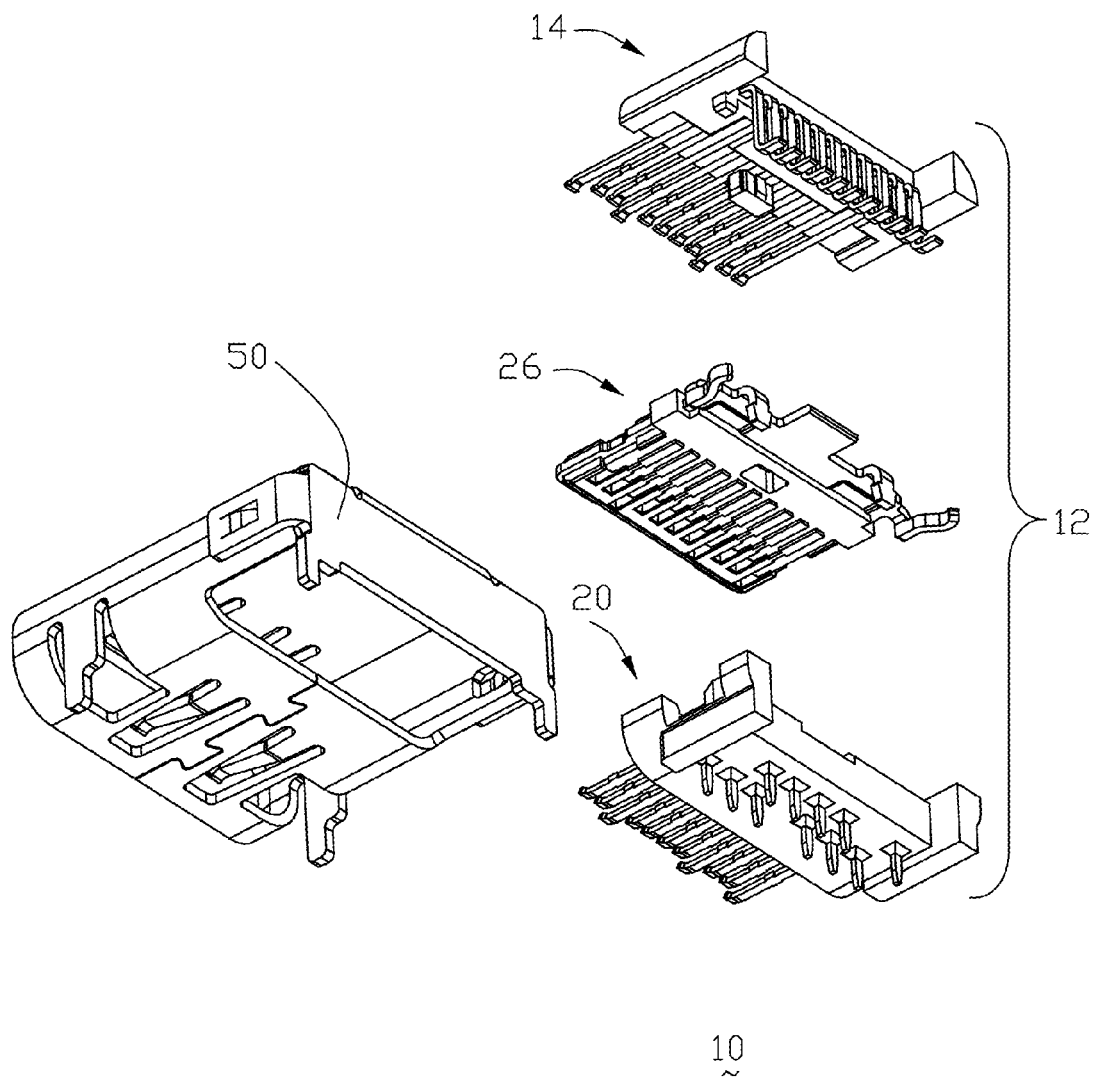
FIG. 3(B) is a rear exploded perspective view of the receptacle connector of FIG. 1.
Figure 4A:
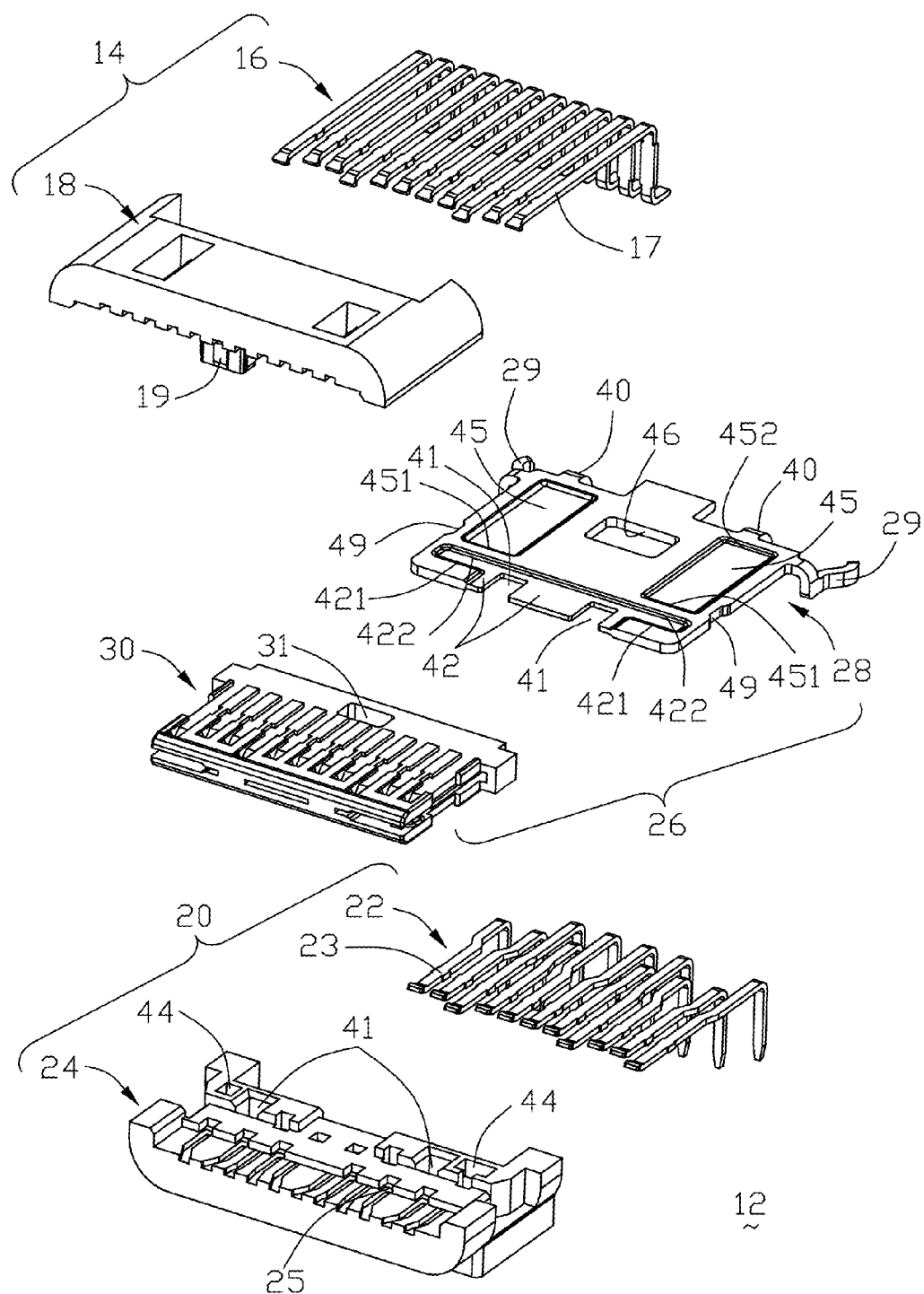
FIG. 4(A) is a front exploded perspective view of the terminal assembly of the receptacle connector of FIG. 1.
Figure 4B:
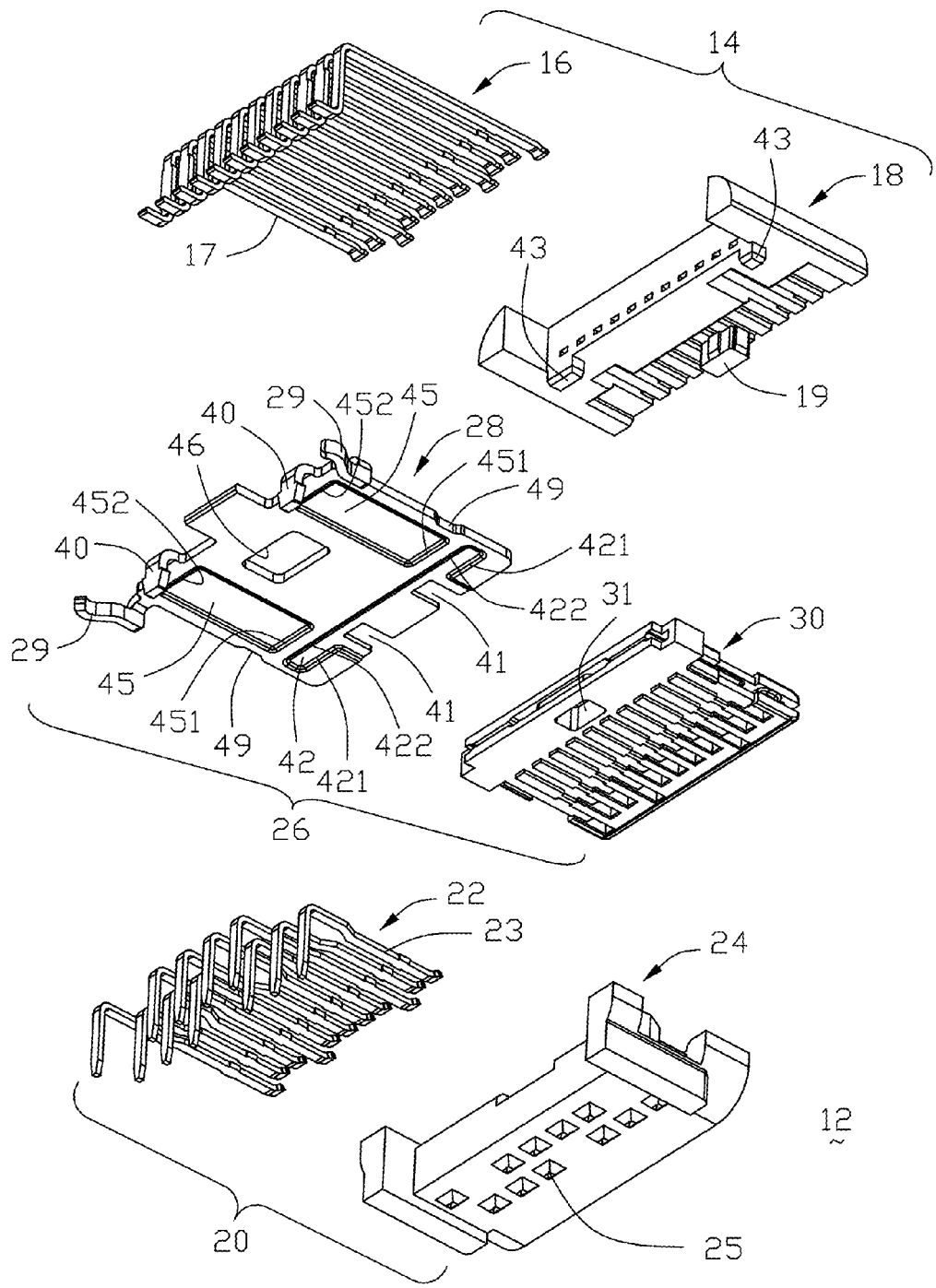
FIG. 4(B) is a rear exploded perspective view of the terminal assembly of the receptacle connector of FIG. 4(A).

Reference will now be made in detail to the preferred embodiment of the present invention.

Referring to FIGS. 1-8(D), an electrical connector of a receptacle connector 10 includes a terminal assembly 12 (essentially composed of terminals and the corresponding insulative housing) enclosed within the metallic shield 50 wherein the metallic shield forms a mating cavity in which a mating tongue formed by the terminal assembly extends forwardly. The terminal assembly 12 includes an upper terminal module 14 with a plurality of upper contacts 16 insert-molded within an upper insulator 18, a lower terminal module 20 with a plurality of lower contacts 22 insert-molded within a lower insulator 24, and a shielding plate module 26 with a metallic shielding plate 28 insert-molded within a middle insulator 30 and sandwiched between the upper terminal module 14 and the lower terminal module 20. The contacting sections 17 of the upper contacts 16 are positioned upon an upper surface of the shielding plate module 26, and the contacting sections 23 of the lower contacts are positioned upon the lower surface of the shielding plate module 26 so as to cooperate with the shielding plate module 26 to commonly form the mating tongue of the receptacle connector 10. In this embodiment, the upper contacts 16 are surface mounted upon the printed circuit board while the lower contacts 22 extend through the corresponding through holes in the printed circuit board.

Notably, the lower insulator 24 includes through holes 25 through which the tails of the lower contacts 22 extend downwardly.

The contacting sections 17 of the upper contacts 16 are transversely restrictively spaced/isolated from one another by the middle insulator 30 around the upper surface thereof and the contacting sections 23 of the lower contacts 22 are transversely restrictively spaced/isolated from one another by the middle insulator 30 around the lower surface thereof. In this embodiment, the upper insulator 18 forms a center protrusion 19 which is adapted to be received within the hole 31 of the middle insulator 30 for retaining the upper terminal module 14 with regard to the shielding plate module 26. The shielding plate 28 includes a pair of lances 40 adapted to be latchably received within the holes 41 of the lower insulator 24 for retaining the shielding plate module 26 to the lower terminal module 12. Therefore, the upper terminal module 14, the shielding plate module 26 and the lower terminal module 12 can be aligned with one another and stacked together.

This embodiment is derived from the provisional application 61/926,270 which is similar to what is disclosed in the provisional application 61/916,147 and 61/927,951. The shielding plate 28 forms a pair of spring tabs 29 on two opposite lateral sides for contacting the shield 50 after assembled. In this embodiment, there are two cutouts 41 in a front edge region. The cutout 21 may have the corresponding power contact escape from the shielding plate 28 for avoiding potential shorting. The shielding plate further forms a thinned area 42 around a front region. This thinned area allows the corresponding middle insulator 30 to be applied thereon in a complaint manner so as to allow the front ends of the corresponding contacts to inwardly extend, thus resulting in a lead-in configuration for better retention of the corresponding contacts and easy insertion of the complementary plug connector. Notably, the thinned area 42 also help the impedance control and forms a pair of confrontation edges 421 and 422 with regard to the remaining portions of the shielding plate 28. Other two large thinned areas 45 occupy most portions of the shielding plate 28 for SS impedance control as mentioned in the related provisional application 61/919,681, and forms a pair of confrontation edges 451 and 452 with regard to the remaining portions of the shielding plate 28. In this embodiment, the shielding plate 28 forms an opening 46 for corresponding to the hole 31 of the middle insulator 30 during the insert-molding process. The upper insulator 18 further includes two side protrusions 43 received within the corresponding holes 44 of the lower insulator 24. Similar to what is disclosed in the parent application and the corresponding provisional application, the shielding plate 28 forms a pair of notches 49 for latching with the locking heads of the corresponding latch of the complementary plug connector illustrated later. It is also noted that to comply with the notch 49 of the shielding plate 28, the middle insulator 30, i.e., the mating tongue, forms, in two opposite lateral sides, a pair of recesses 33 which are essentially aligned with and closely located inside the pair of notches 49 in the transverse direction. Notably, on one hand, the shielding plate 28 is rigid without deflection around the notch 49. On the other hand, in the top view along the vertical direction, the recess 33 is inwardly recessed, in the transverse direction, from the remaining portions of the corresponding lateral side and essentially configurationally in compliance with the corresponding notch 49 for compliantly latching the locking head of the corresponding latch of the plug connector. The structure/function of the notch of the shielding plate and/or the recess of the mating tongue may be referred to the provisional application 61/917,363 or 61/919,681 of which the benefit/priority is claimed. Notably, the notches of the shielding plate and/or the corresponding recesses of the insulative portion of the mating tongue is/are the common feature(s) of the receptacle connectors in all the embodiments of the invention.

Figure 5A:
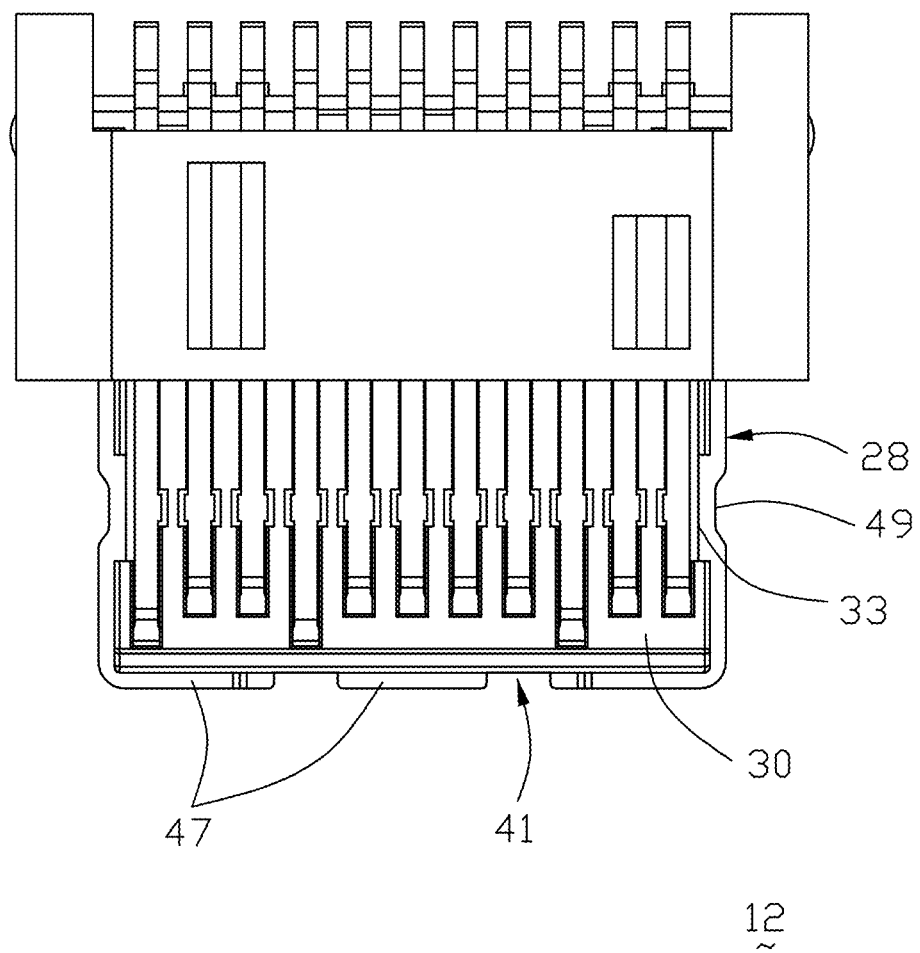
FIG. 5(A) is a top view of the terminal assembly of the receptacle connector of FIG. 4(A).
Figure 5B:
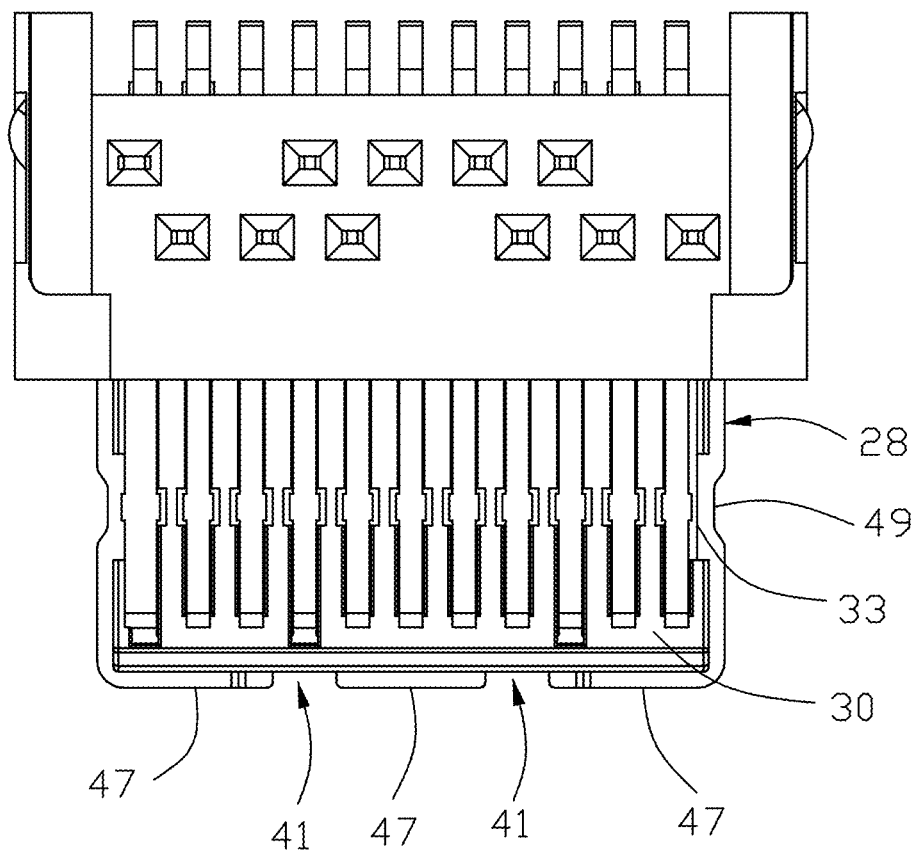
FIG. 5(B) is a bottom view of the terminal assembly of the receptacle connector of FIG. 5(A).

FIGS. 5(A) and 5(B) show the front edge 47 of the shielding plate 28 extends beyond a front edge of the middle insulator 30. On the other hand, a front section of the cutout 41 is exposed to an exterior.

Figure 6A:
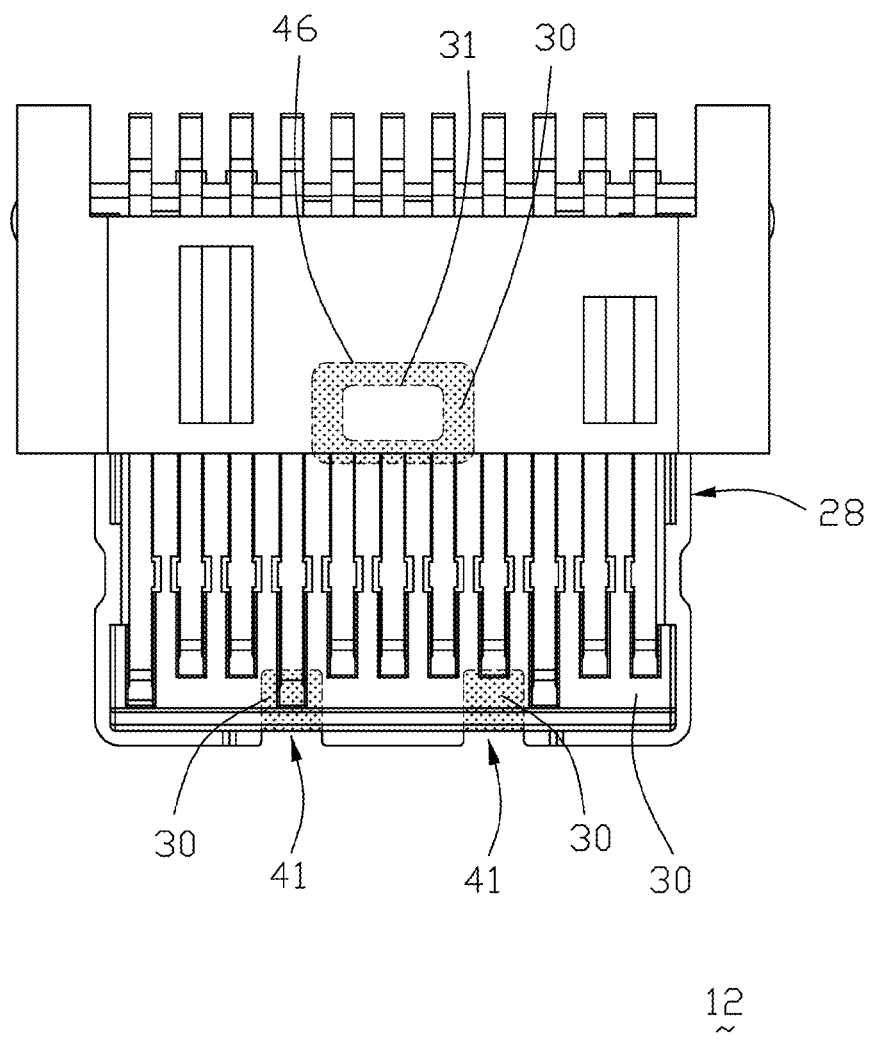
FIG. 6(A) is a top view of the terminal assembly of the receptacle connector of FIG. 5(A) with partially transparent image to show how the insulator of the shielding plate module cooperates with the shielding plate via an insert molding process.
Figure 6B:
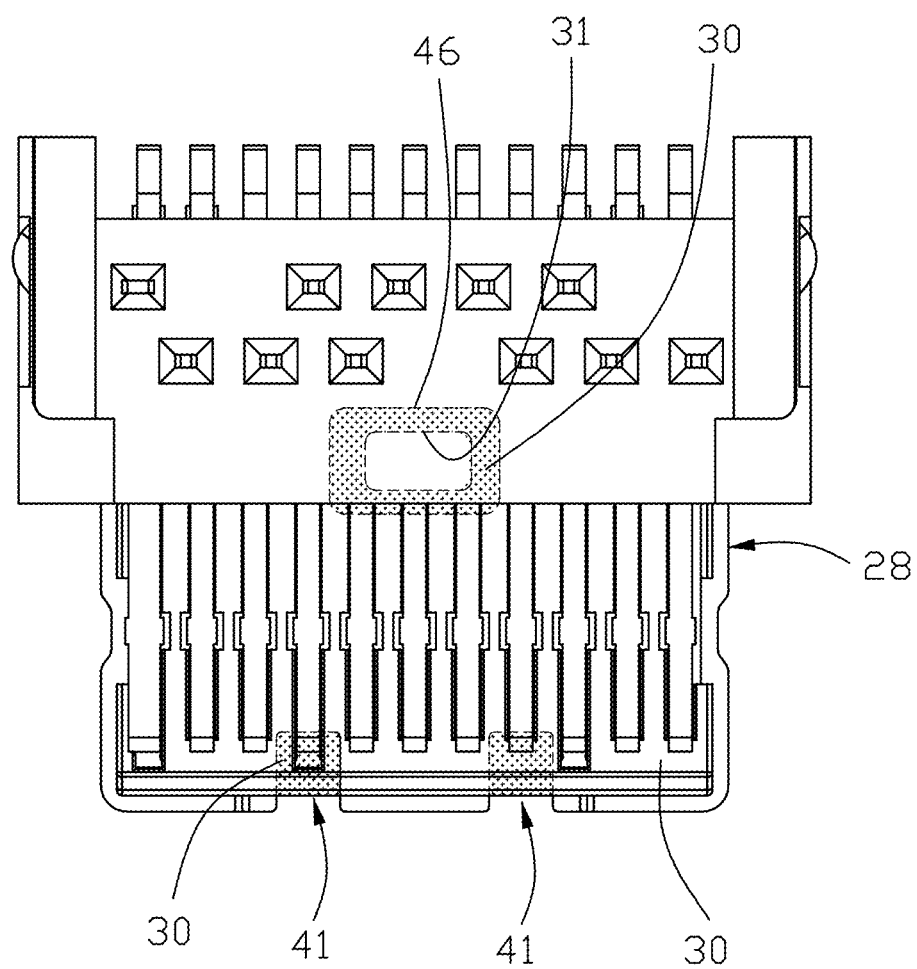
FIG. 6(B) is a bottom view of the terminal assembly of the receptacle connector of FIG. 6(A) with partially transparent image to show how the insulator of the shielding plate module cooperates with the shielding plate via an insert molding process.
Figure 7:
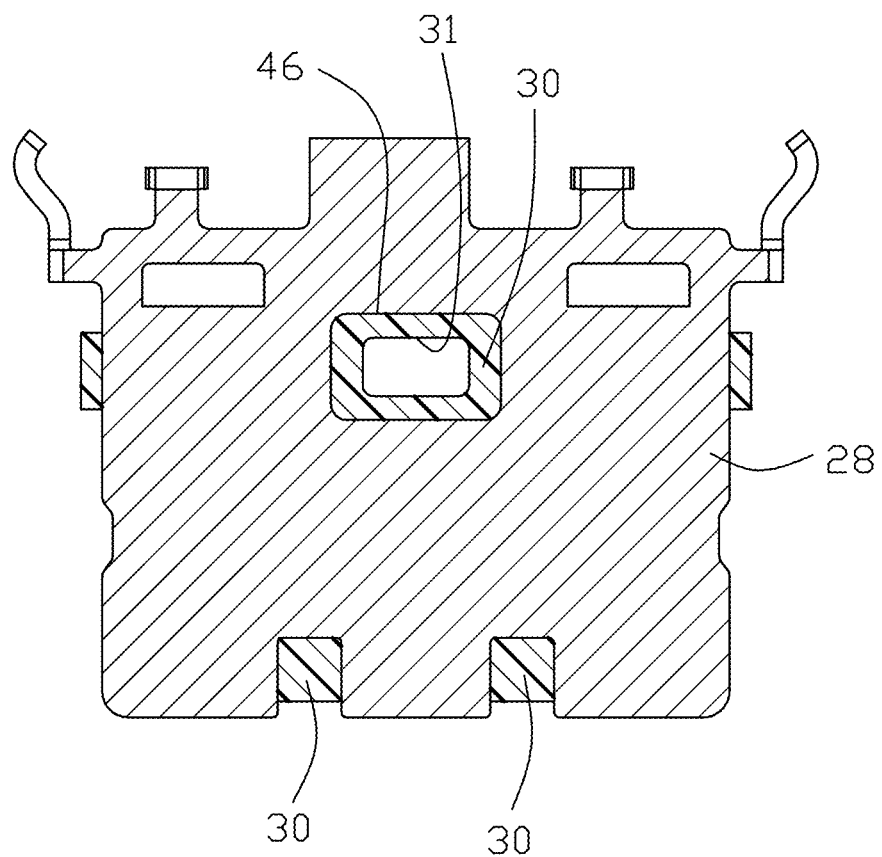
FIG. 7 is a cross-sectional view of the shielding plate module of the terminal assembly of FIG. 4(A).
Figure 7A:
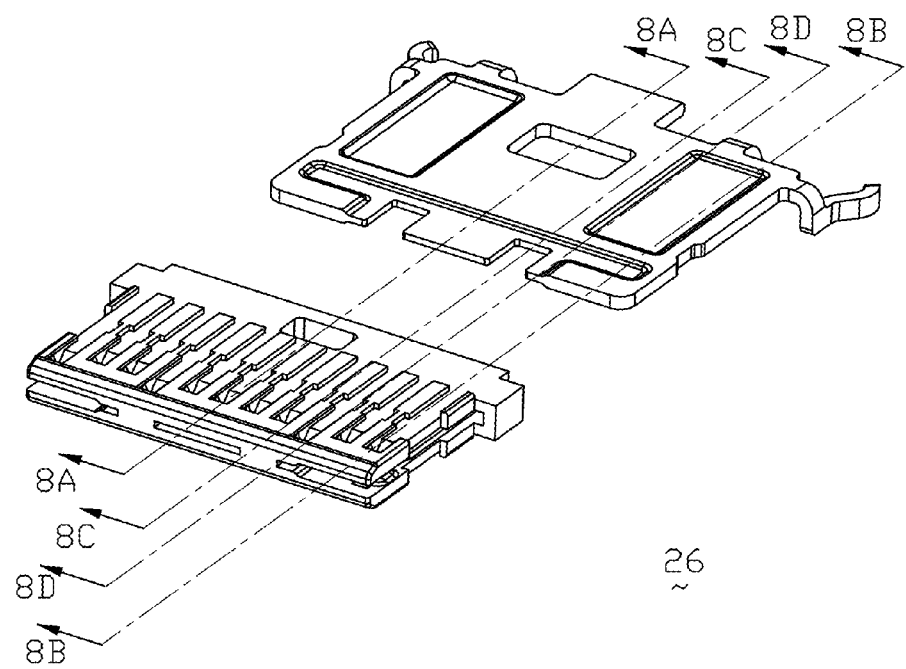
FIG. 7(A) is a perspective view of the shielding plate module of FIG. 7.

FIGS. 6(A) and 6(B) and 7 show the material of the middle insulator 30 fills remaining portions of the cutout 41 during the insert-molding process. Similarly, the material of the middle insulator 30 fills a periphery portion of the hole 46 of the shielding plate 28 and form the hole 31 thereof.

Figure 8A:
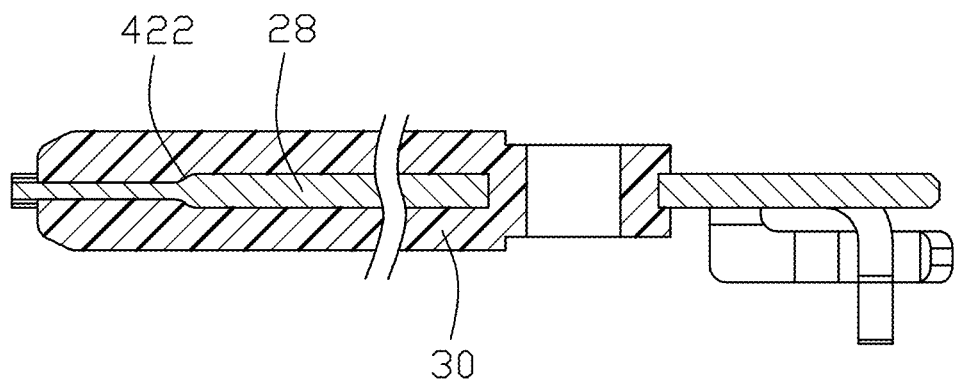
FIG. 8(A) is a cross-sectional view of the shielding plate module of FIG. 7 along line 8(A)-8(A).
Figure 8B:
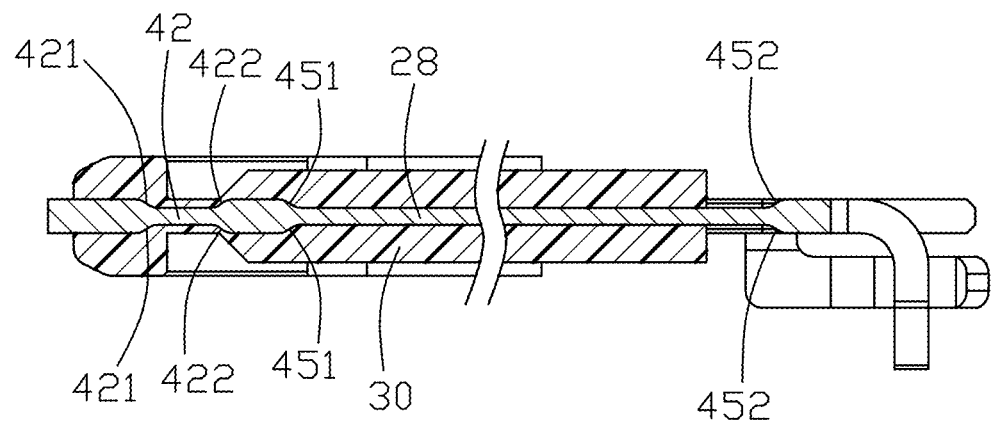
FIG. 8(B) is another cross-sectional view of the shielding plate module of FIG. 7 along line 8(B)-8(B).
Figure 8C:
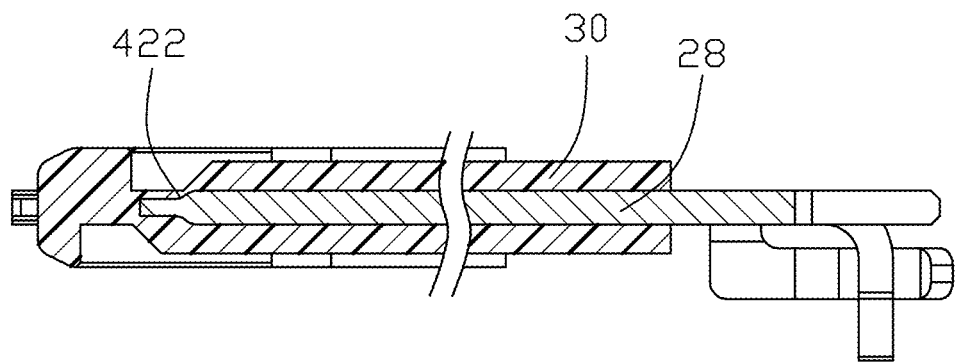
FIG. 8(C) is another cross-sectional view of the shielding plate module of FIG. 7 along line 8(C)-8(C).
Figure 8D:
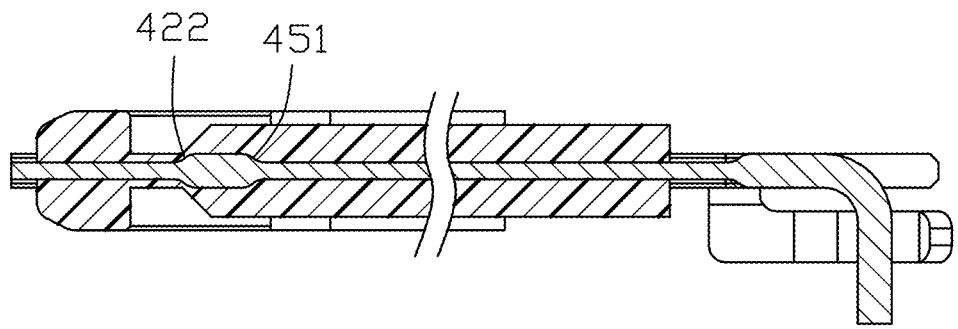
FIG. 8(D) is another cross-sectional view of the shielding plate module of FIG. 7 along line 8(D)-8(D).

FIG. 8(A) shows the cross-sectional view of the shielding plate module 26 along line 8(A)-8(A). FIG. 8(B) shows the cross-sectional view of the shielding plate module 26 along line 8(B)-8(B) wherein in the shielding plate 28 because the material of the middle insulator 30 engages the confrontation edges 421, 422 so as to provide retention between the shielding plate 28 and the middle insulator 30 along the front-to-back direction. On the other hand, the material of the middle insulator 30 engages the confrontation edges 422, 451 also provides retention between the shielding plate 28 and the middle insulator 30 along the front-to-back direction. FIG. 8(C) shows the cross-sectional view of the shielding plate module 26 along line 8(C)-8(C). FIG. 8(D) shows the cross-sectional view of the shielding plate module 26 wherein the middle insulator 30 engages the confrontation edges 422 and 451 to provide retention between the shielding plate 28 and the middle insulator 30 along the front-to-back direction.

Figure 9:
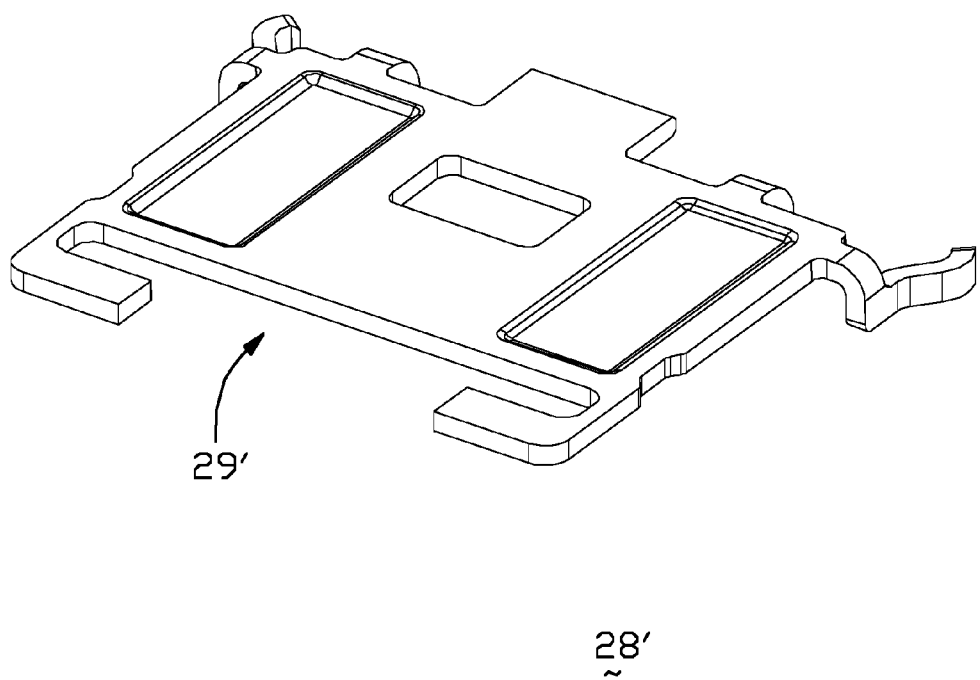
FIG. 9 is a front perspective view of another embodiment of the shielding plate of the receptacle connector of the instant invention.
Figure 10:
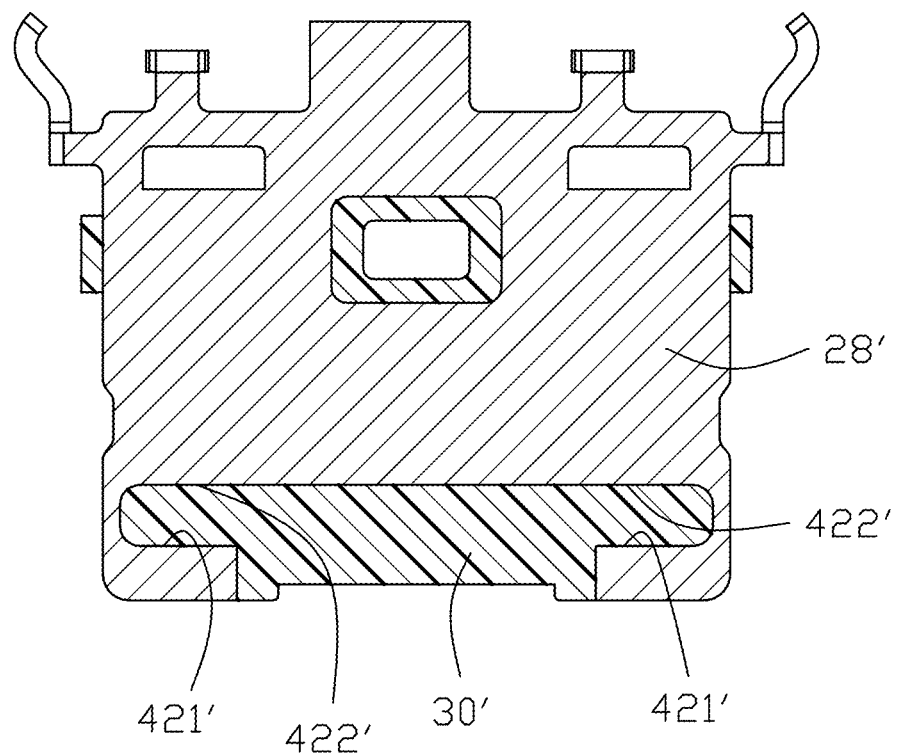
FIG. 10 is a cross-sectional view of the shielding plate module according to the shielding plate of FIG. 9.
Figure 10A:
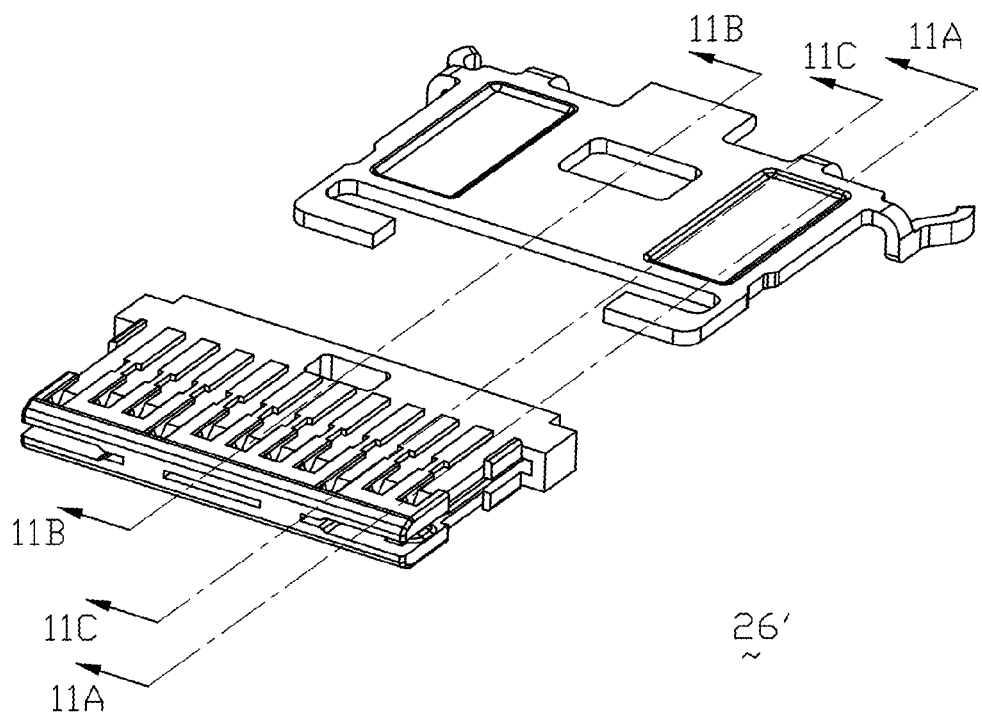
FIG. 10(A) is a perspective view of the shielding plate module according to FIG. 10.
Figure 11A:
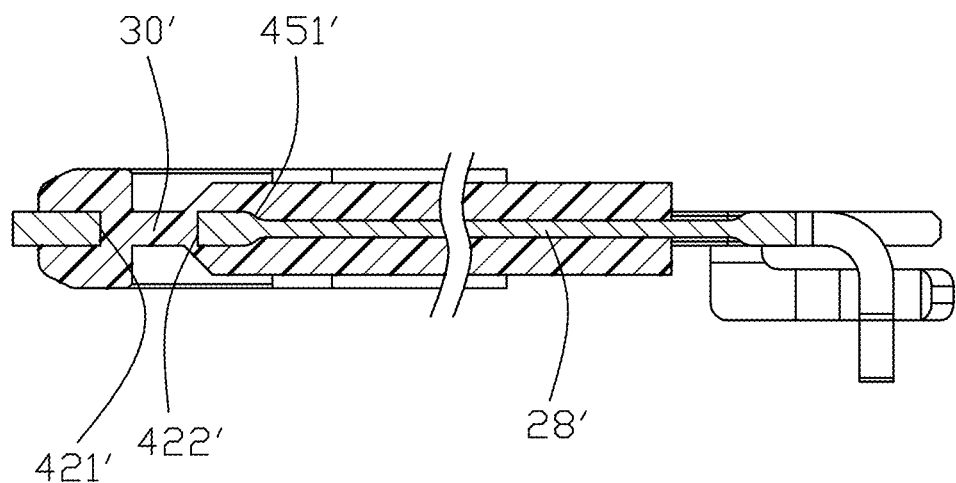
FIG. 11(A) is a cross-sectional view of the shielding plate module of FIG. 10 along line 11(A)-11(A).
Figure 11B:
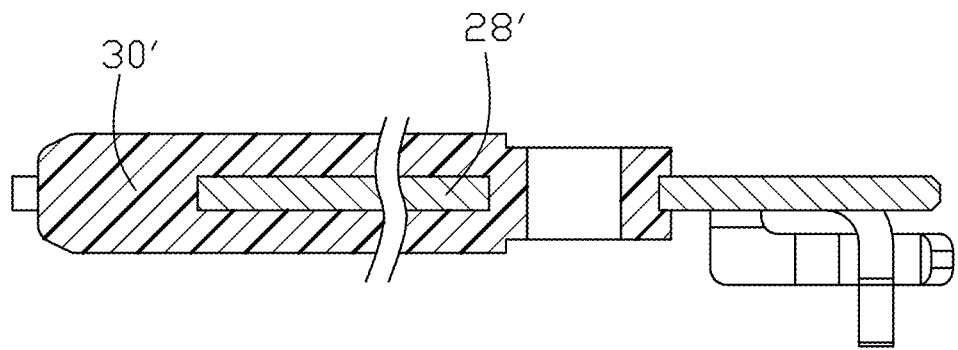
FIG. 11(B) is another cross-sectional view of the shielding plate module of FIG. 10 along line 11(B)-11(B).
Figure 11C:
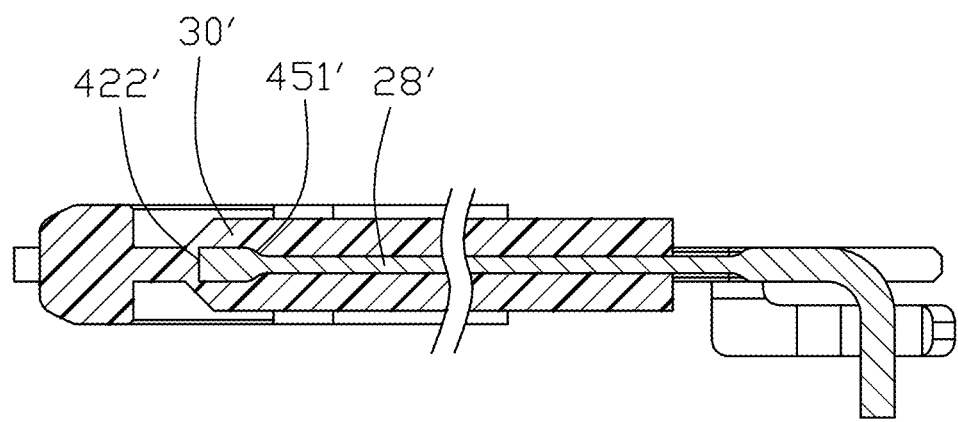
FIG. 11(C) is another cross-sectional view of the shielding plate module of FIG. 10.

As already disclosed in the related provisional application 61/926,270, in an alternate embodiment the thinned area 42 may be removed from the shielding plate 28' to form an empty area 29', as shown in FIG. 9. FIG. 10, compared with FIG. 7, shows after the insert-molding process, the middle insulator 30' fills the corresponding empty area 29'. Under this situation, compared with FIGS. 8(A)-8(D), FIG. 11(A) shows the cross-sectional view of the shielding plate module 26' wherein different from the upper confrontation edge 421 and the lower confrontation edge 421 which are spaced from each other by the thinned area 42 in FIG. 8(A), the confrontation edge 421' extends through the shielding plate 28' in the vertical direction. Similarly, the confrontation edge 422' extends through the shielding plate 28' in the vertical direction. Under this situation, the middle insulator 30' engages the confrontation edge 421' and 422' to provide retention between the shielding plate 28' and the middle insulator 30' along the front-to-back direction. On the other hand, the middle insulator 30' engages the confrontation edge 422' and 451' also provides retention between the shielding plate 28' and the middle insulator 30' along the front-to-back direction. FIG. 11(B) shows the cross-sectional view of the shielding plate module 26' along line 11(B)-11(B). FIG. 11(C) shows the cross-sectional view of the shielding plate module 26' along line 11(C)-11(C) wherein the middle insulator 30' engages the confrontation edges 422' and 451' to provide retention between the middle insulator 30' and the shielding plate 28'.

Figure 12A:
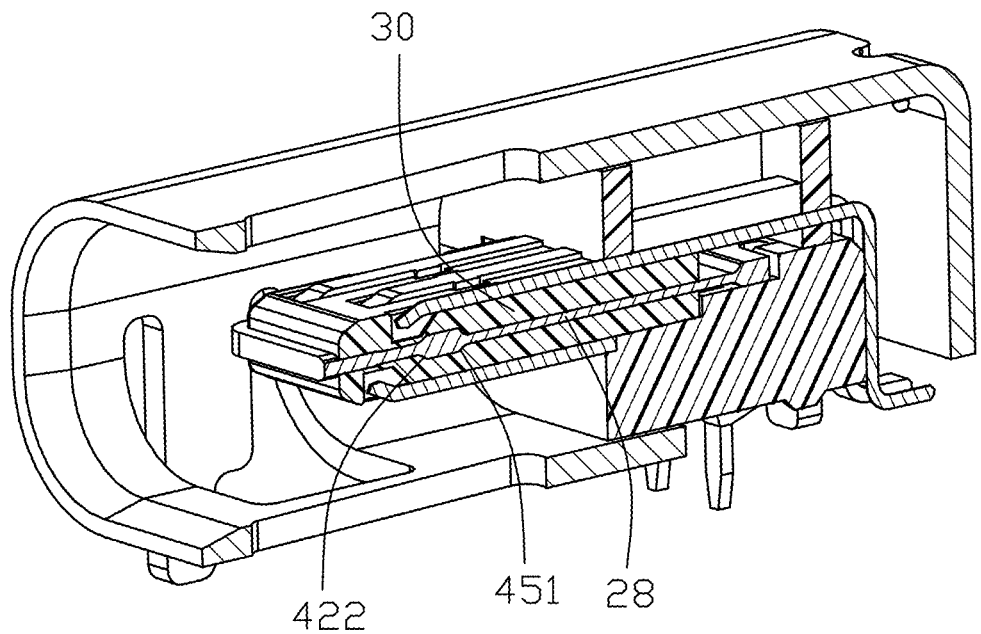
FIG. 12(A) is a perspective cross-sectional view of the receptacle connector of FIG. 1.
Figure 12B:
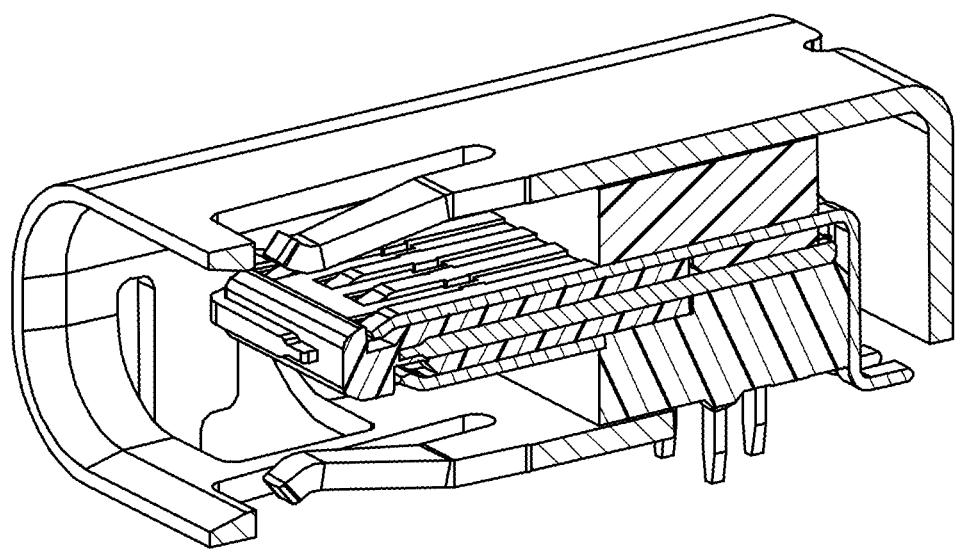
FIG. 12(B) is another perspective cross-sectional view of the receptacle connector of FIG. 1.

FIG. 12(A) shows the cross-sectional view of the receptacle connector 10 along a vertical plane similar to what is shown in FIG. 8(D) wherein the middle insulator 30 engages the confrontation edges 422, 451 to provide retention between the shielding plate 28 and the middle insulator 30 along the front-to-back direction. FIG. 12(B) shows the cross-sectional view of the receptacle connector 10 along a vertical plane. FIG. 13 already disclosed in the related provisional application 61/927,951, shows the cross-sectional view of the receptacle connector 10 and the corresponding plug connector 500 mated with each other along the line similar as line 8(B) wherein the middle insulator 30 engages the confrontation edge 421, 422 and 451 in a staggered manner so as to efficiently retain to the shielding plate 28 along the front-to-back direction. Notably, the lances of the shielding plate is inserted into the opening of the lower insulator for retaining the shielding plate module and the lower terminal module together.

Figure 14A:
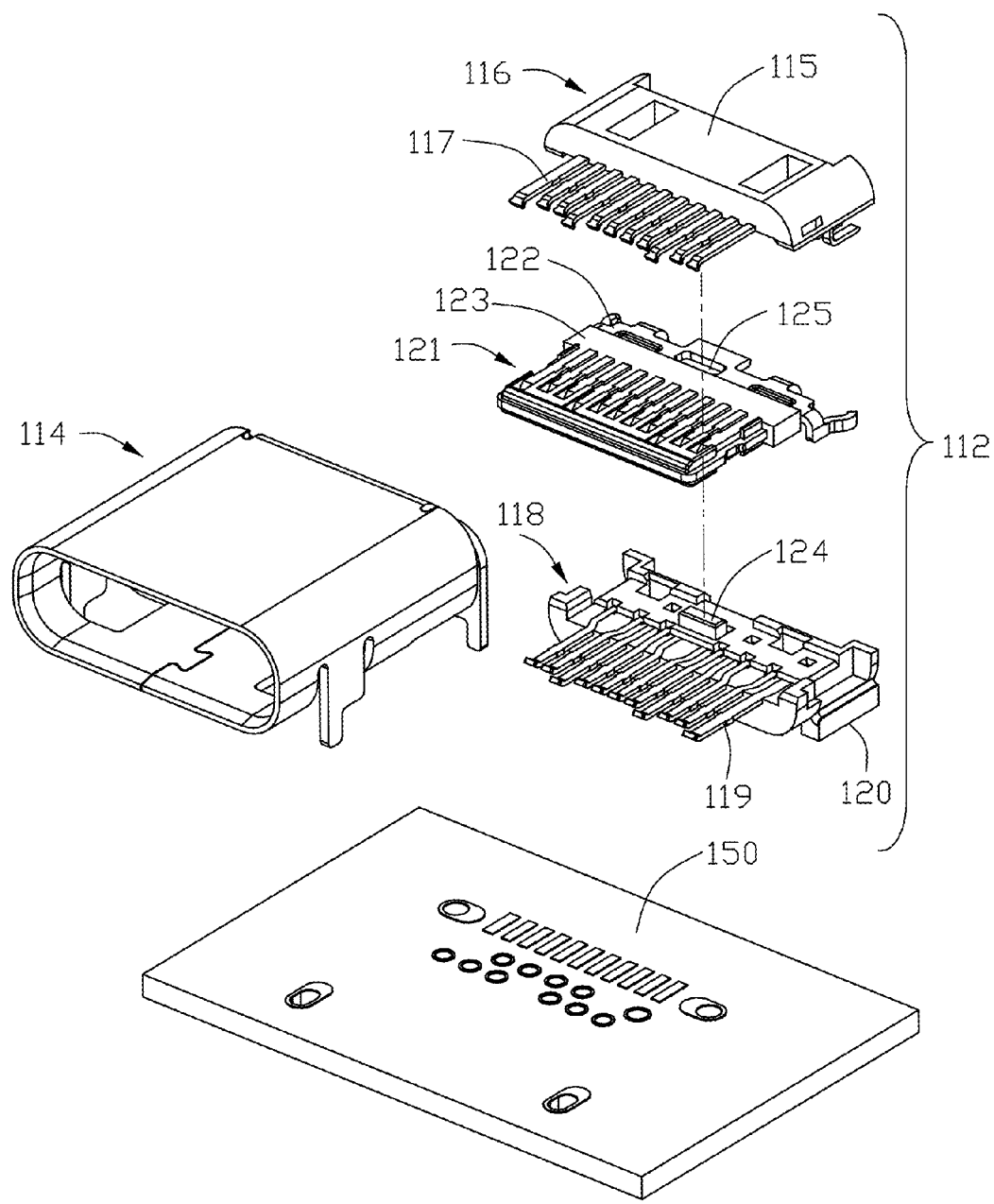
FIG. 14(A) is a front exploded perspective view of another embodiment of the receptacle connector upon the printed circuit board according to the invention.
Figure 14B:
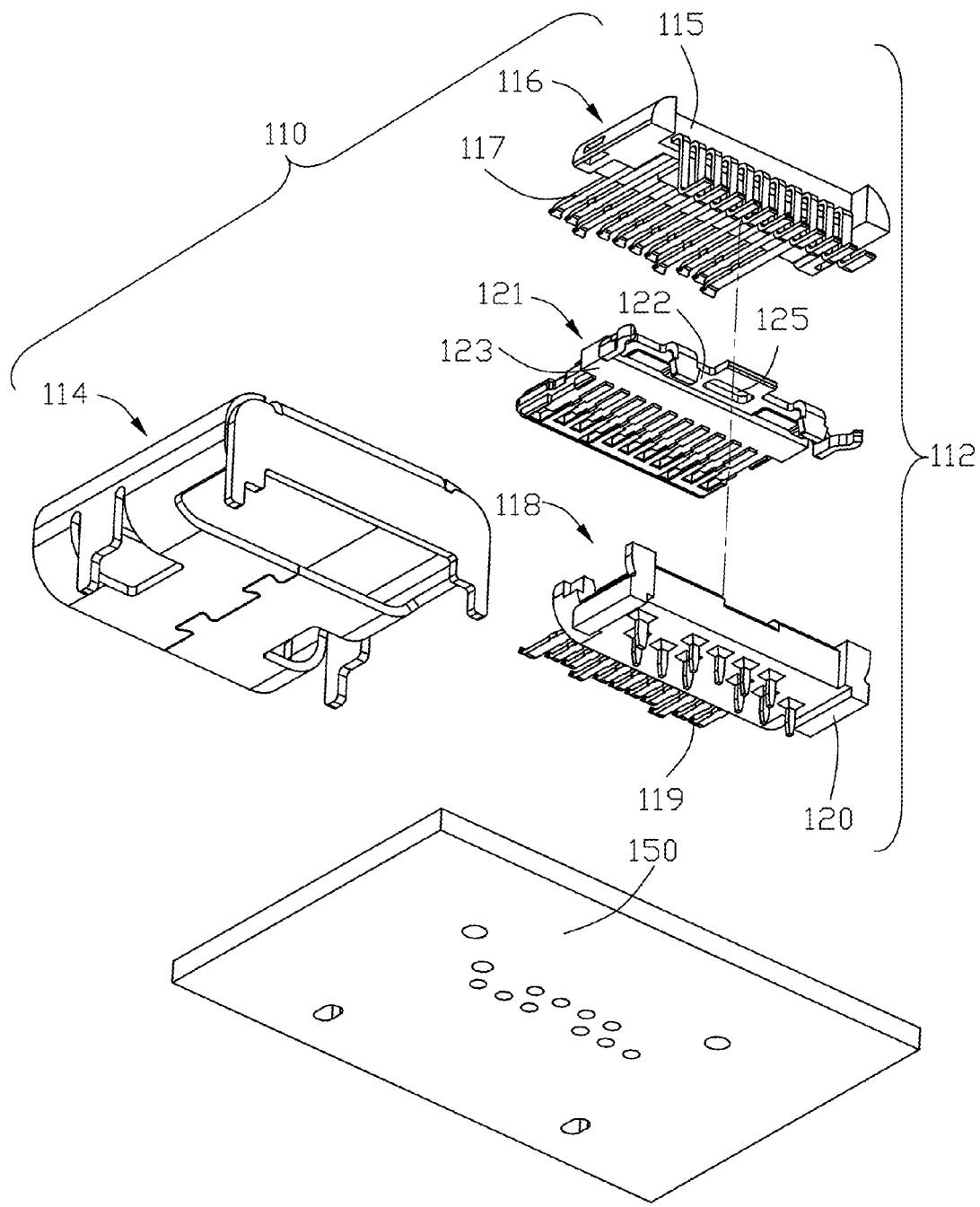
FIG. 14(B) is a rear exploded perspective view of the receptacle connector and the printed circuit board of FIG. 14(A).
Figure 15A:
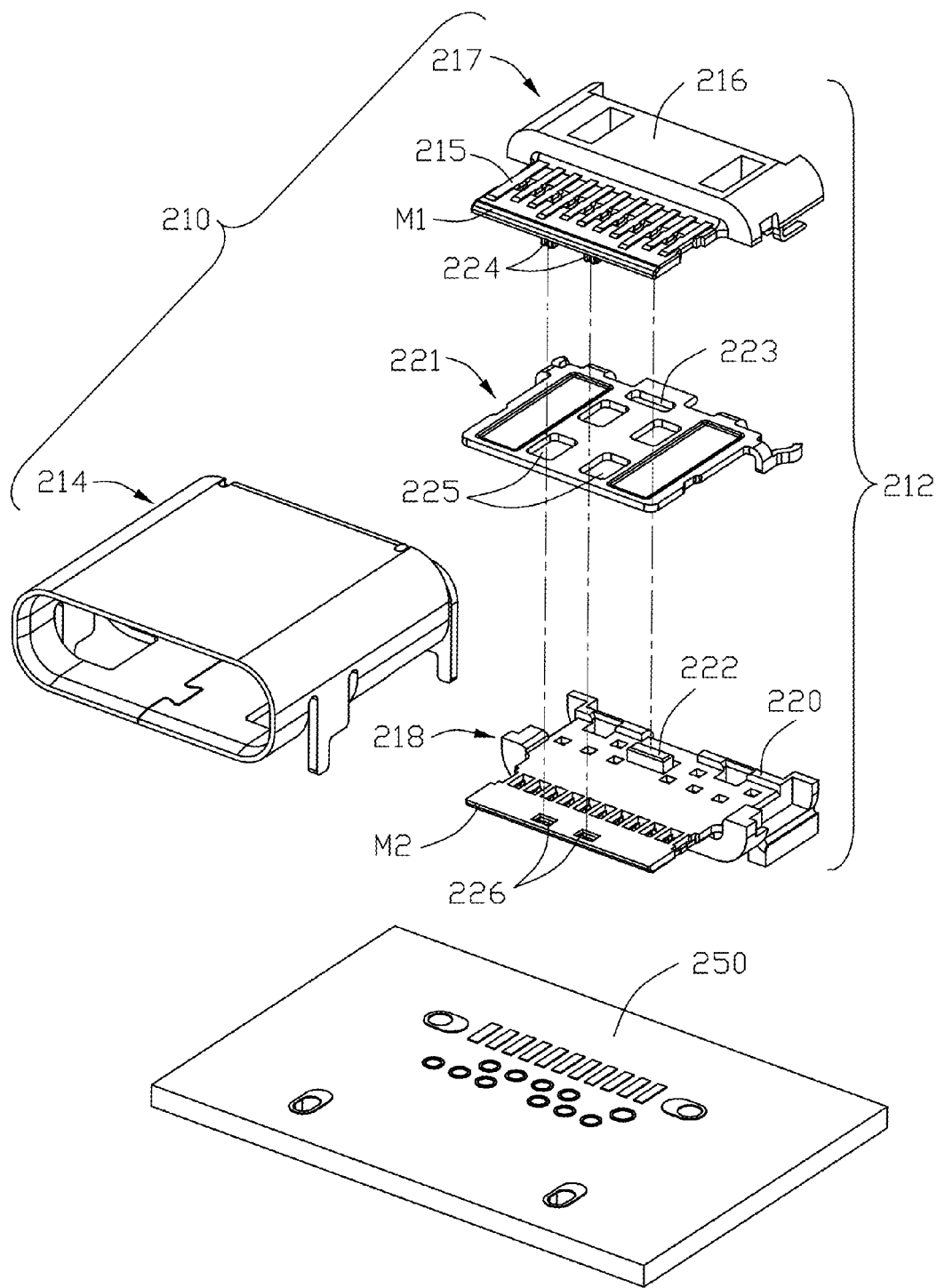
FIG. 15(A) is a front exploded perspective view of another embodiment of the receptacle connector upon the printed circuit board according to the invention.
Figure 15B:
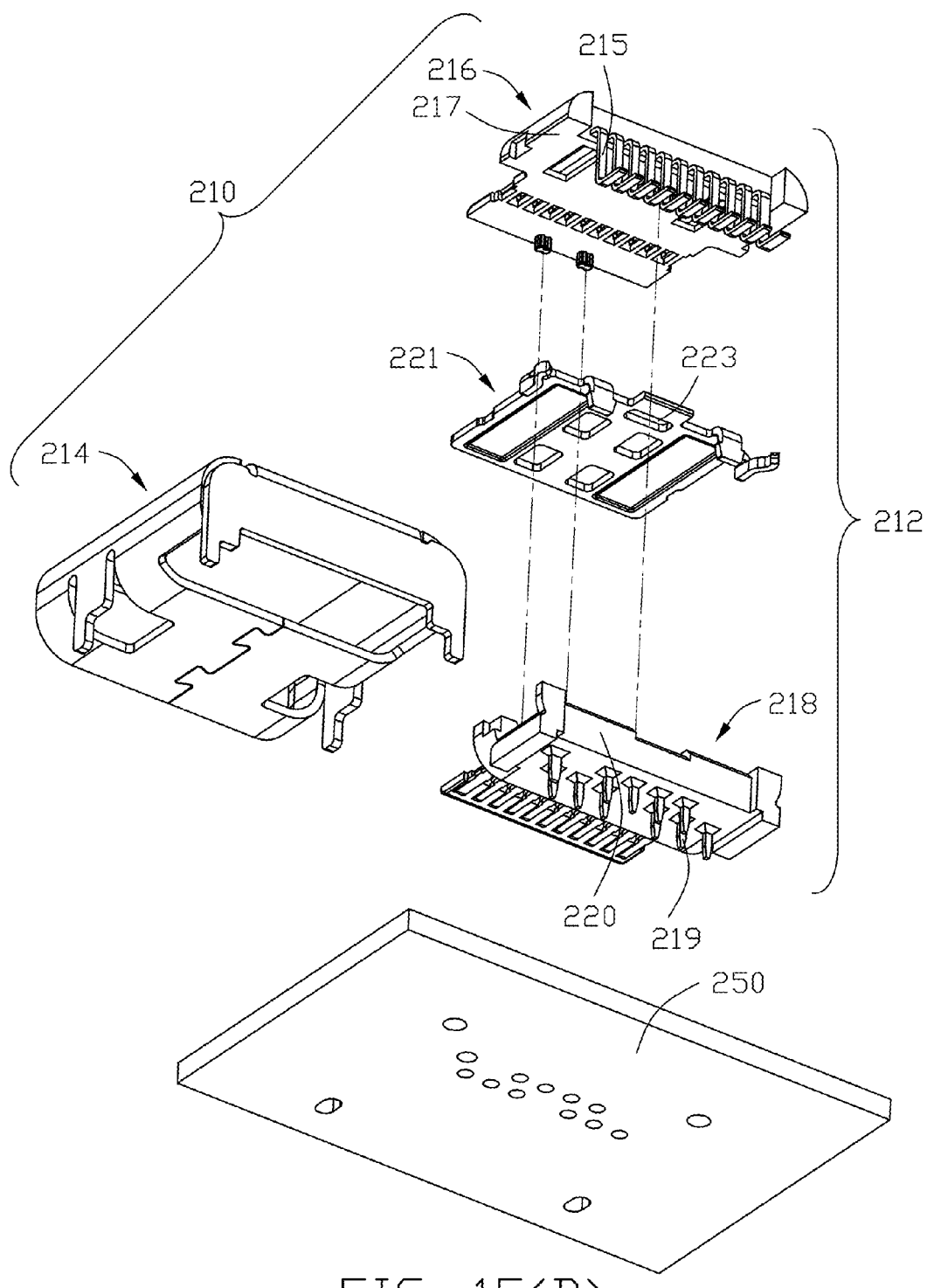
FIG. 15(B) is a rear exploded perspective view of the receptacle connector and the printed circuit board of FIG. 15(A).
Figure 15C:
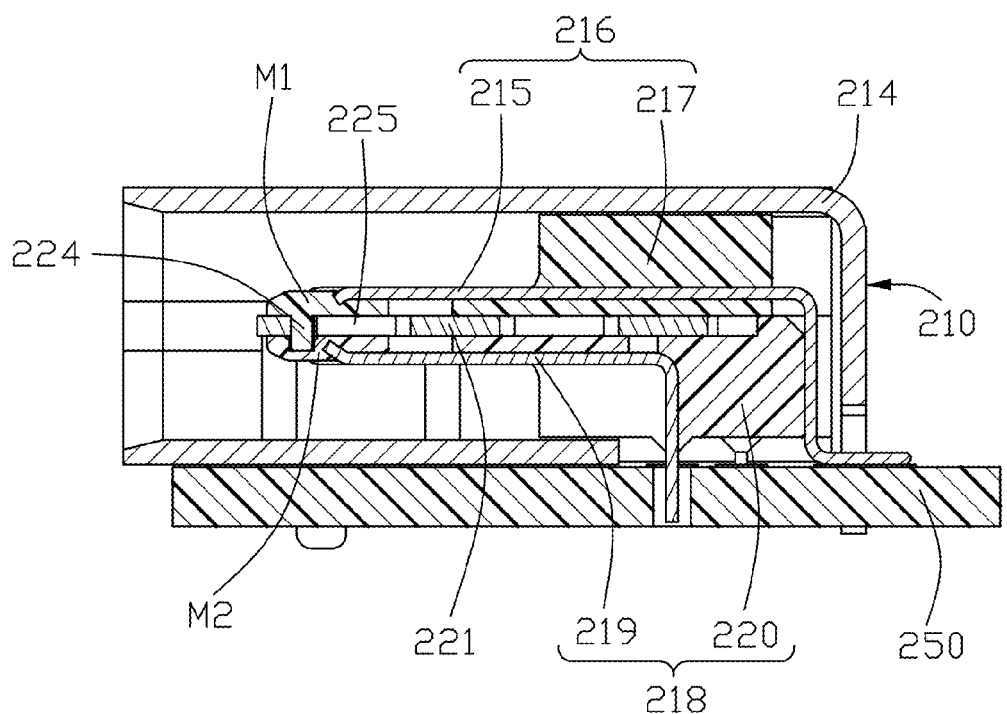
FIG. 15(C) is a cross sectional view of the receptacle connector and the printed circuit board of FIG. 15(A).
Figure 16A:
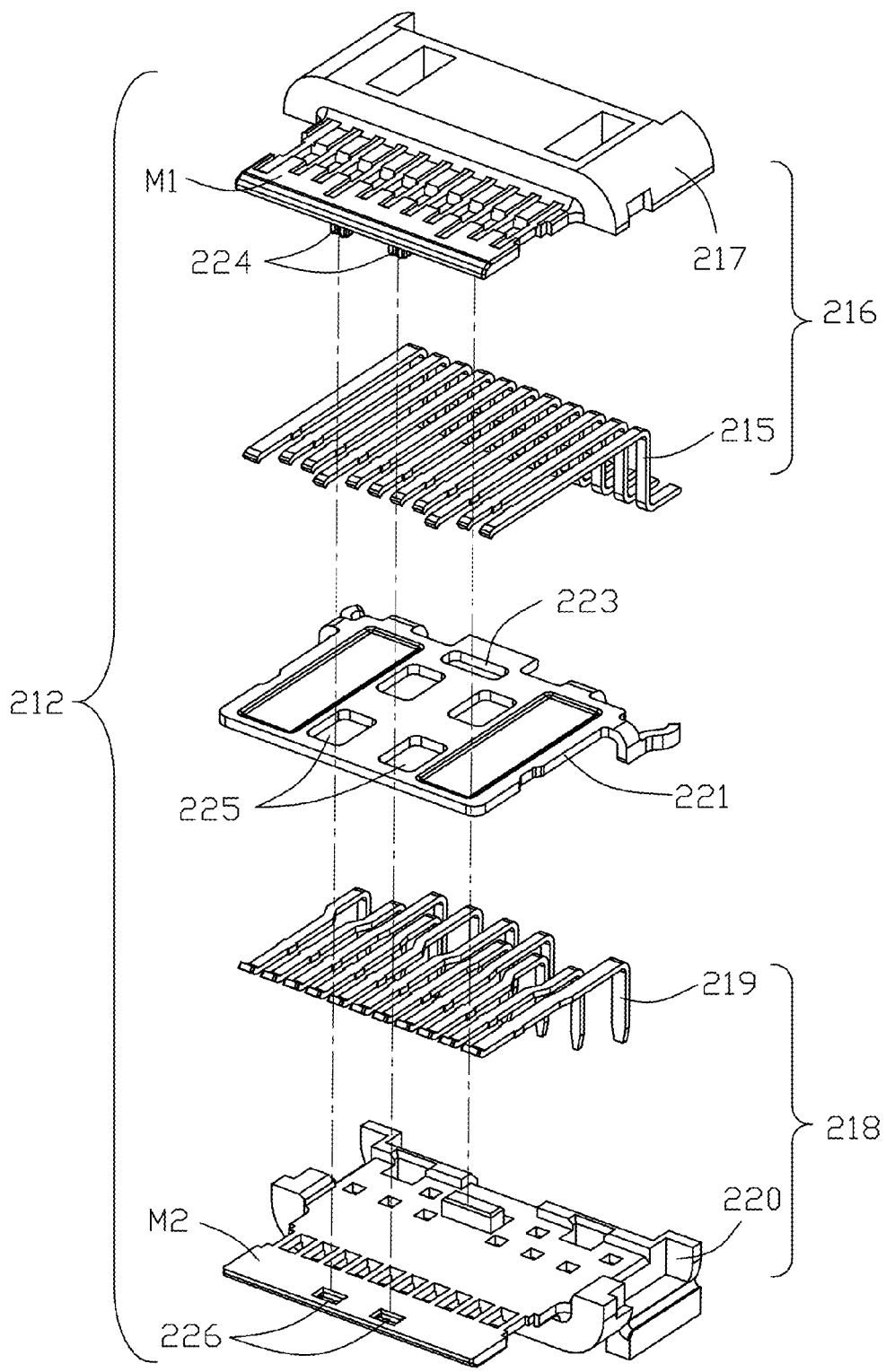
FIG. 16(A) is a front exploded perspective view of the terminal assembly of the receptacle connector of FIG. 15(A).
Figure 16B:
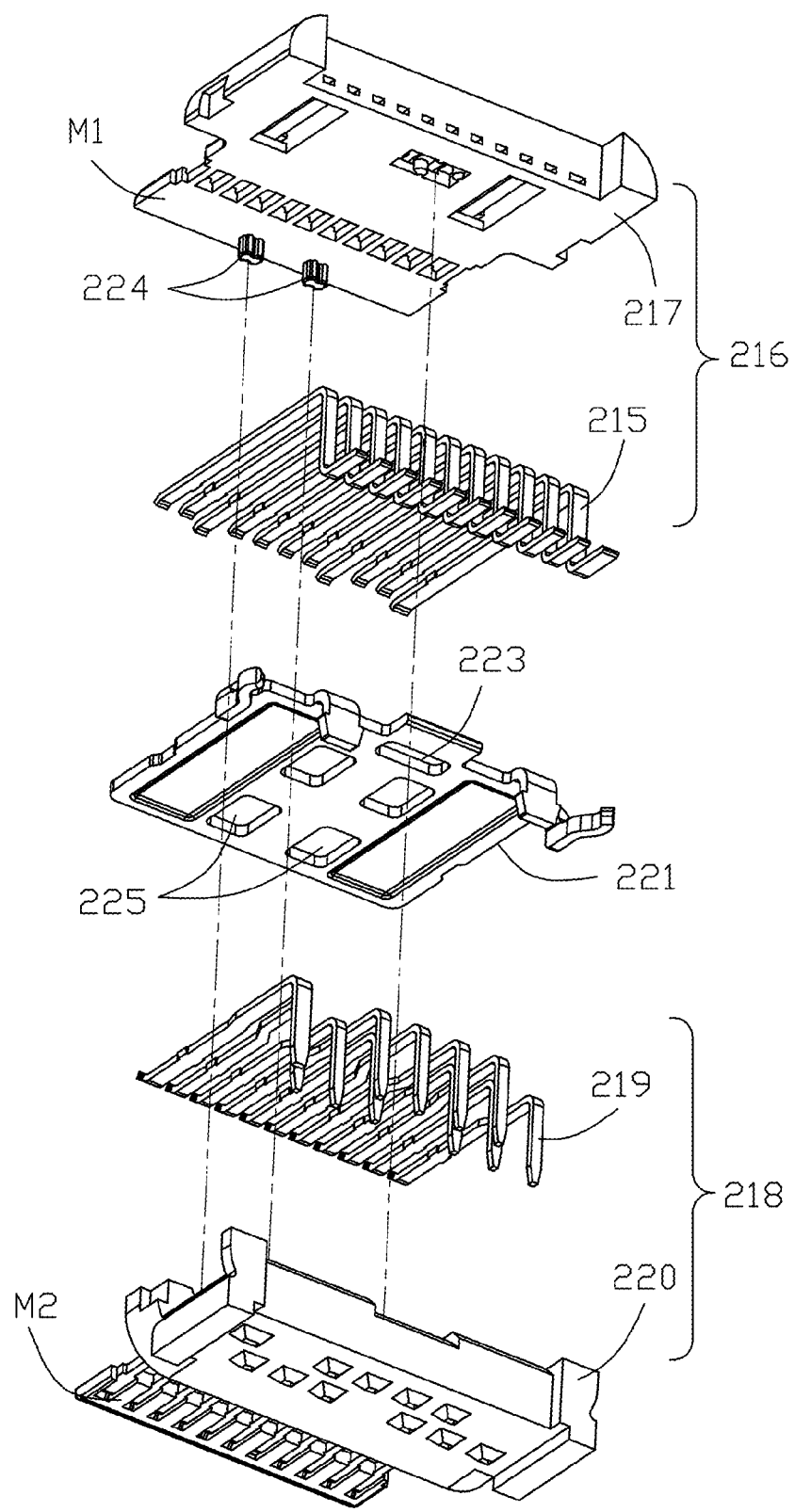
FIG. 16(B) is a rear exploded perspective view of the terminal assembly of the receptacle connector of FIG. 16(A).

FIGS. 14(A) and 14(B) show the similar embodiment to that in FIGS. 1-13 wherein the receptacle connector 110 mounted upon the printed circuit board 150, includes a terminal assembly 112 enclosed within the metallic shield 114. The terminal assembly 112 includes the upper terminal module 116 with the upper terminals 117 embedded within the upper insulator 115 via an insert-molding process, the lower terminal module 118 with the lower terminals 119 embedded within the lower insulator 120 via an insert-molding process, and a shielding plate module 121 sandwiched between the upper terminal module 116 and the lower terminal module 118 with the shielding plate 122 embedded within the middle insulator 123 via an insert-molding process. The lower insulator 120 includes an upward protrusion 124 extending through the hole 125 in the shielding plate 122 and further into the recess in an undersurface of the upper insulator 115 wherein the recess is not shown in FIGS. 14 (A) and 14(B) while being viewable via FIGS. 17-22 and 33. It is noted that different from the previous embodiment in FIGS. 1-13, in this embodiment the shielding plate 122 only lacks the corresponding cutout and the corresponding thinned area so as to form a straight and even protruding front edge extending beyond the front edge of the middle insulator 123 rather than the interrupted and uneven protruding front edge of the shielding plate disclosed in the previous embodiment.

FIGS. 15(A)-16(B) show another embodiment of the receptacle connector according to the invention wherein different from the previous embodiment in which the mating tongue is essentially formed by the shielding plate module, in this embodiment the shielding plate is not insert molded within a middle insulator but instead to be directly sandwiched between the upper terminal module and the lower terminal module. Under this situation, the mating tongue is provided by the combined upper terminal module and lower terminal module commonly. The details are illustrated below. An receptacle connector 210 mounted upon the printed circuit board 250, includes a terminal assembly 212 enclosed within a metallic shield 214. The terminal assembly 212 includes an upper terminal module 216 with a plurality of upper terminals 215 embedded within the upper insulator 217 via an insert-molding process, and a lower terminal module 218 with a plurality of lower terminals 219 embedded within the lower insulator 220 via another insert-molding process to cooperate with the upper terminal module 216 to commonly sandwich a metallic shielding plate 221 therebetween in the vertical direction. Similar to the previous embodiment, the lower insulator 220 includes an upward protrusion 222 extending through the opening 223 in the shielding plate 221. In addition, the upper insulator 217 also forms a pair of downward protrusions 224 extending through the corresponding holes 225 of the shielding plate 221 and into the corresponding recesses 226 in the lower insulator 220. Understandably, such protrusion and the corresponding recess are used for aligning the upper insulator 217, the lower insulator 220 and the shielding plate 221 with one another in the vertical direction. Notably, different from the previous embodiment the mating tongue is provided by the shielding plate module, in this embodiment the mating tongue includes an upper part M1 of the upper insulator 217 and a lower part M2 of the lower insulator 220 to sandwich the shielding plate 221 therebetween in the vertical direction wherein the contacting sections of the upper terminals 215 are exposed upon the upper surface of the upper part M1 and the contacting sections of the lower terminals 219 are exposed upon an undersurface of the lower insulator 220.

Figure 17:
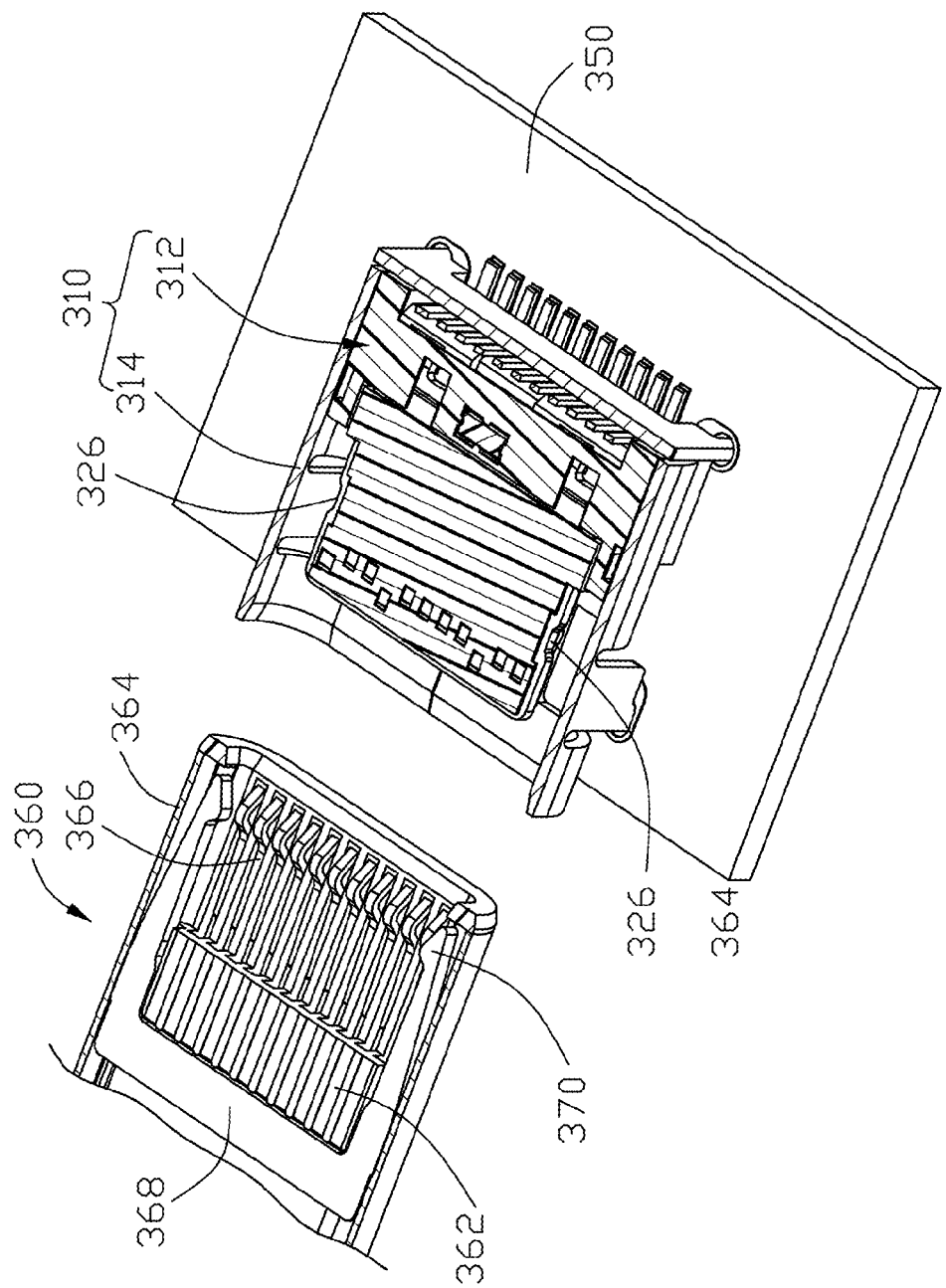
FIG. 17 is an exploded perspective cross-sectional view of the receptacle connector of FIG. 14 (A) and the corresponding plug connector according to the invention. It is noted that the plug connector herewith is applied to all other embodiments of the instant invention.
Figure 18:
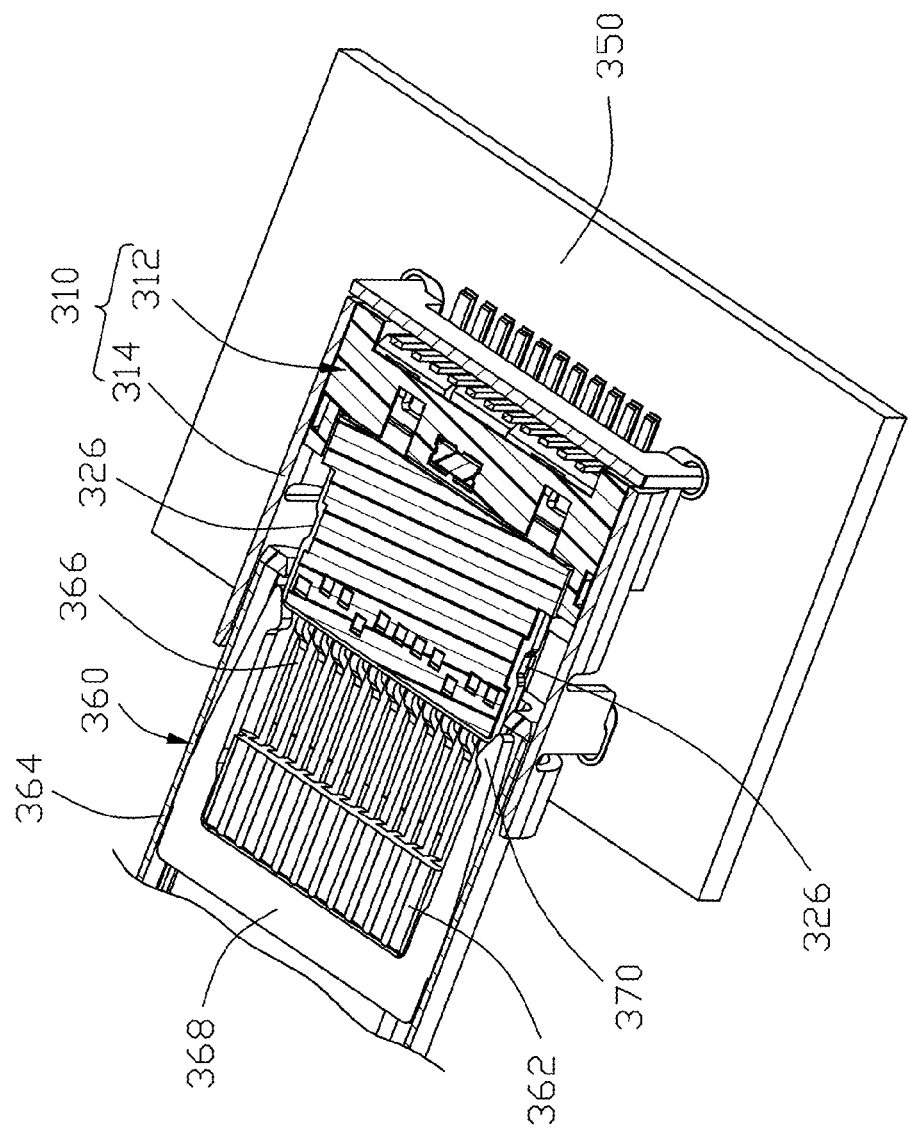
FIG. 18 is a perspective cross-sectional view of the receptacle connector and the plug connector of FIG. 17 at an initial mating stage of mating.

FIGS. 17-22 show the receptacle connector in the previous embodiment of FIGS. 14(A) and 14(B) mated with the corresponding plug connector at different stages. It is noted that the cross-section of FIGS. 17-18 is taken via a horizontal plane of middle insulator above and adjacent to the shielding plate in the vertical direction. The receptacle connector 310 essentially same to the receptacle connector 110 and mounted upon the printed circuit board 350, includes a terminal assembly 312 enclosed within the metallic shield 314. The terminal assembly 312 includes an upper terminal module 316 with a plurality of upper terminals 315 embedded within the upper insulator 317 via an insert-molding process, and a lower terminal module 318 with a plurality of lower terminals 319 embedded within the lower insulator 320 via another insert-molding process to cooperate with the upper terminal module 316 to sandwich therebetween in the vertical direction the shielding plate module 321 with the metallic shield plate 322 embedded within a middle insulator 323 via another insert-molding process. Similar to the previous embodiment, the shield 314 forms mating cavity and the mating tongue formed by the terminal assembly 312 extends forwardly. Further similar to the previous embodiments, the shielding plate 322 forms a pair of notches 326 in two opposite lateral sides for latching with the corresponding latch of the plug connector illustrated later.

The plug connector 360 includes an insulative housing 362 enclosed within the metallic shell 364 which is adapted to be received within the mating cavity of the receptacle connector 310 during mating. The housing 362 forms a receiving cavity (not labeled) to receive the mating tongue of the receptacle connector 310 during mating. A plurality of contacts 366 are disposed in the housing 362 and communicating with the receiving cavity in the vertical direction for mating with the corresponding contacts 315 and 319 of the receptacle connector 310 during mating, and a U-shaped metallic latch 368 is retained by the housing 362 with two opposite locking heads 370 located on two opposite lateral sides and protruding into the receiving cavity for locking to the corresponding notches 326 of the shielding plate 322.

Figure 19:
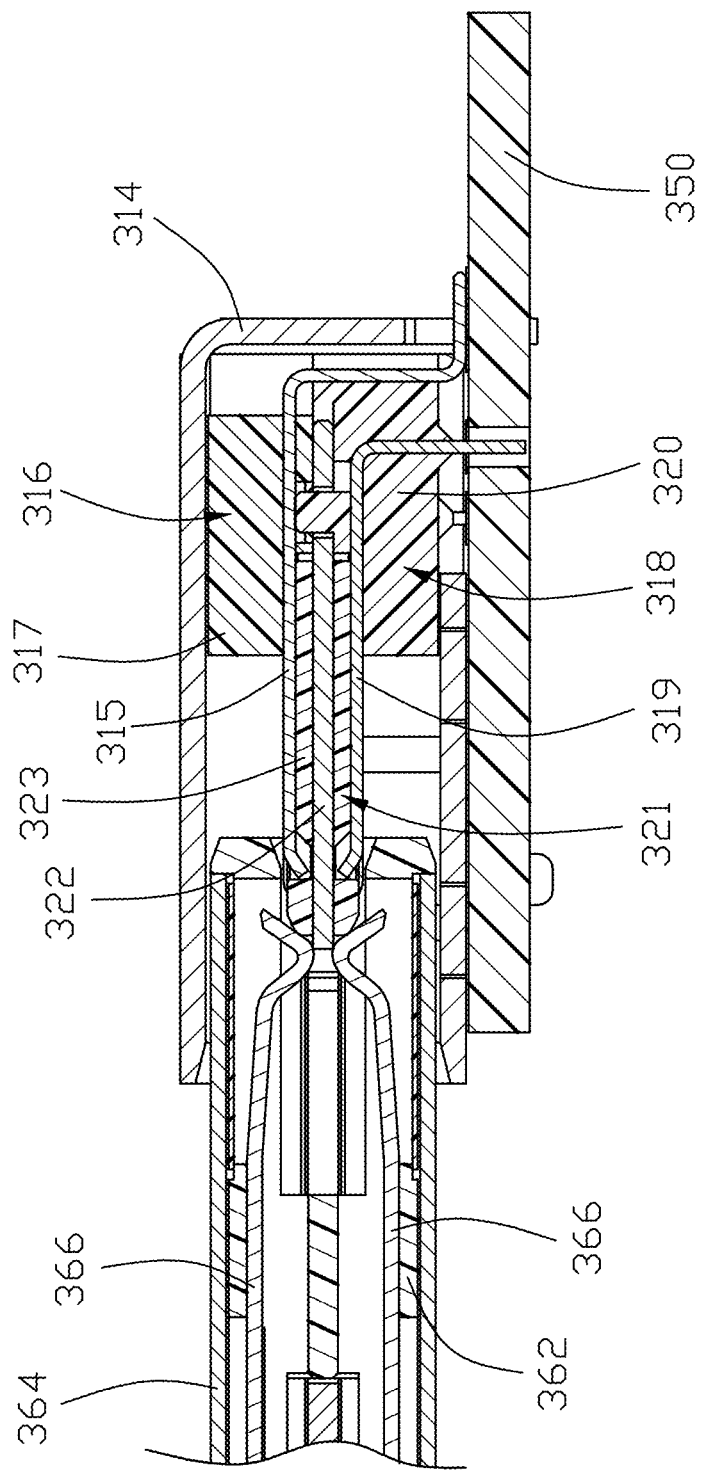
FIG. 19 is another cross-sectional view of the receptacle connector and the plug connector of FIG. 17 at an intermediate stage of mating.
Figure 20:
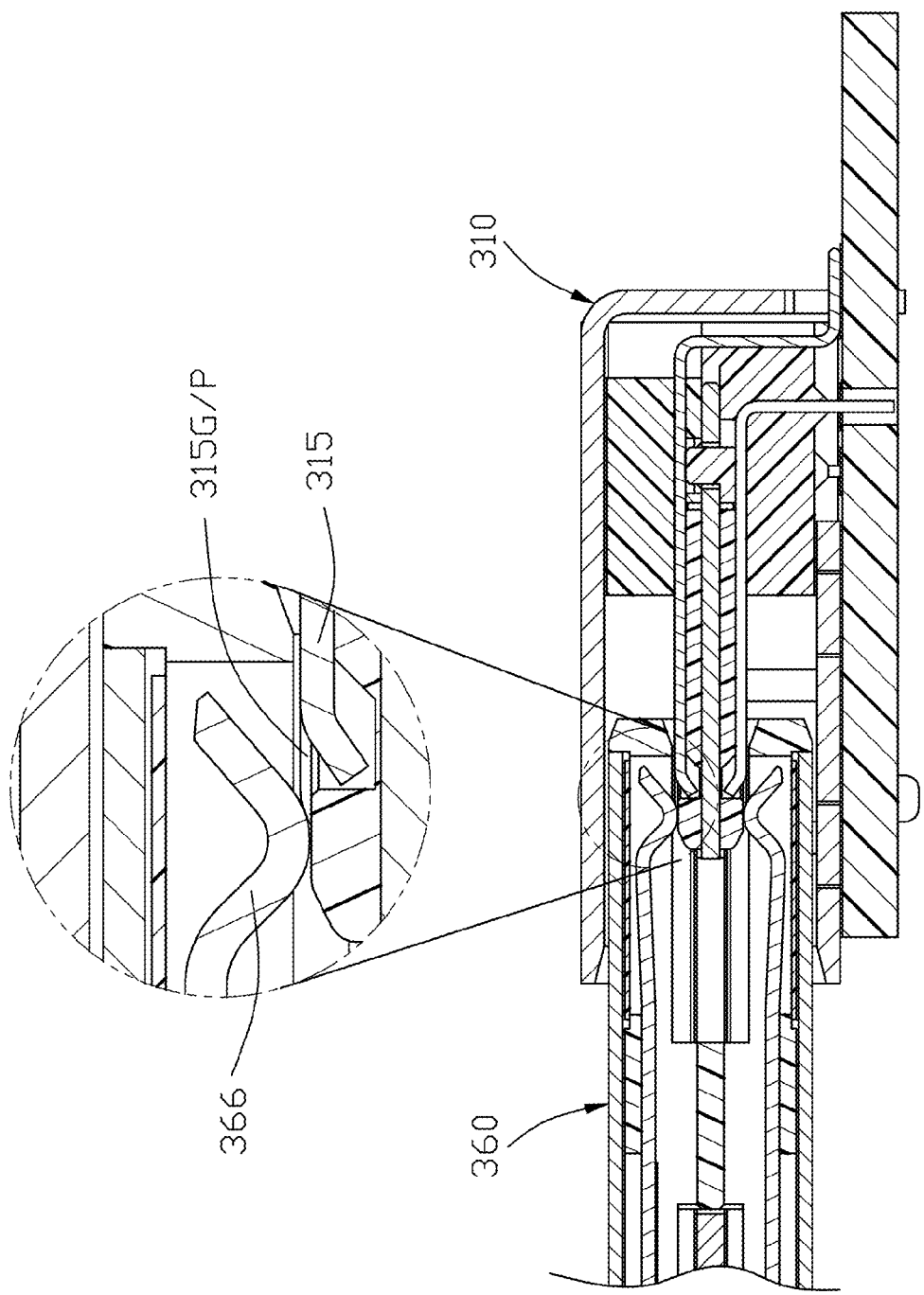
FIG. 20 is another cross-sectional view of the receptacle connector and the plug connector of FIG. 17 at a further intermediate stage of mating.
Figure 21:
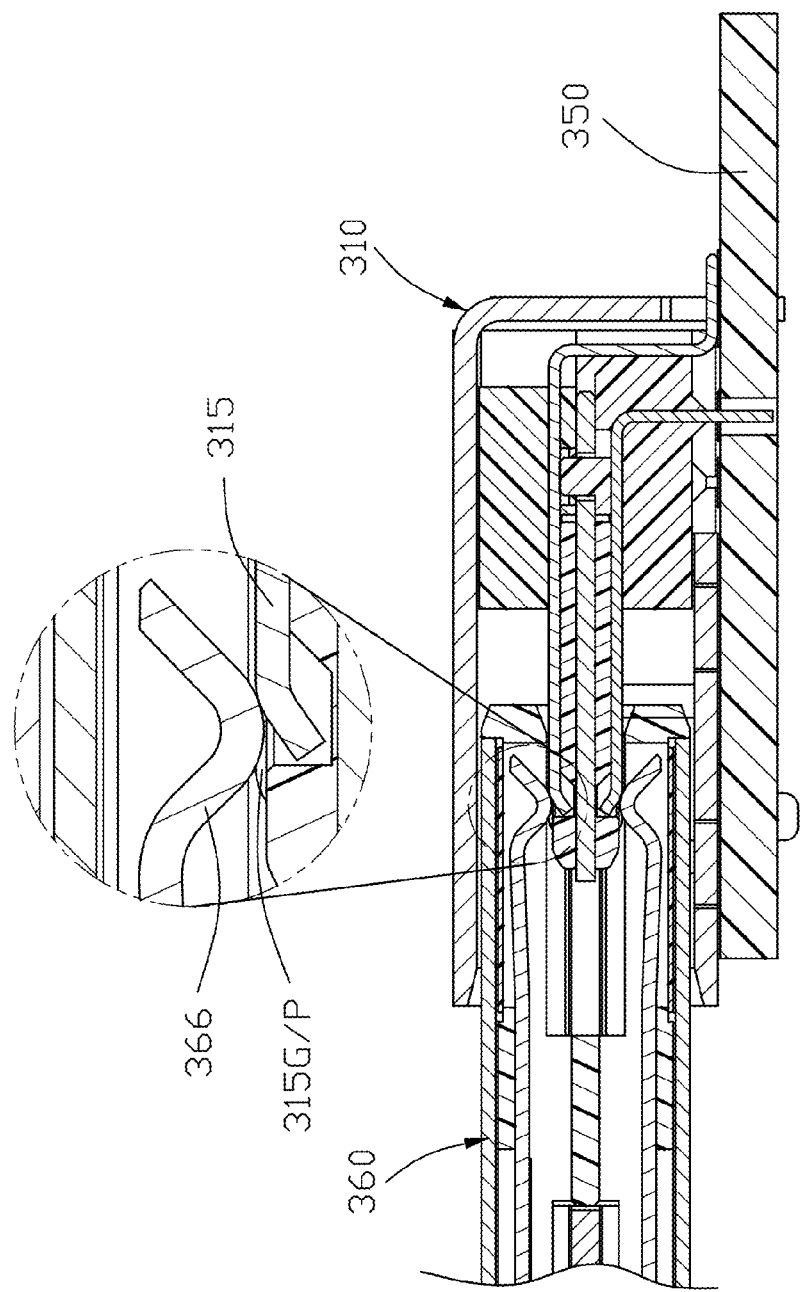
FIG. 21 is another cross-sectional view of the receptacle connector and the plug connector of FIG. 17 at a further intermediate stage of mating.
Figure 22:
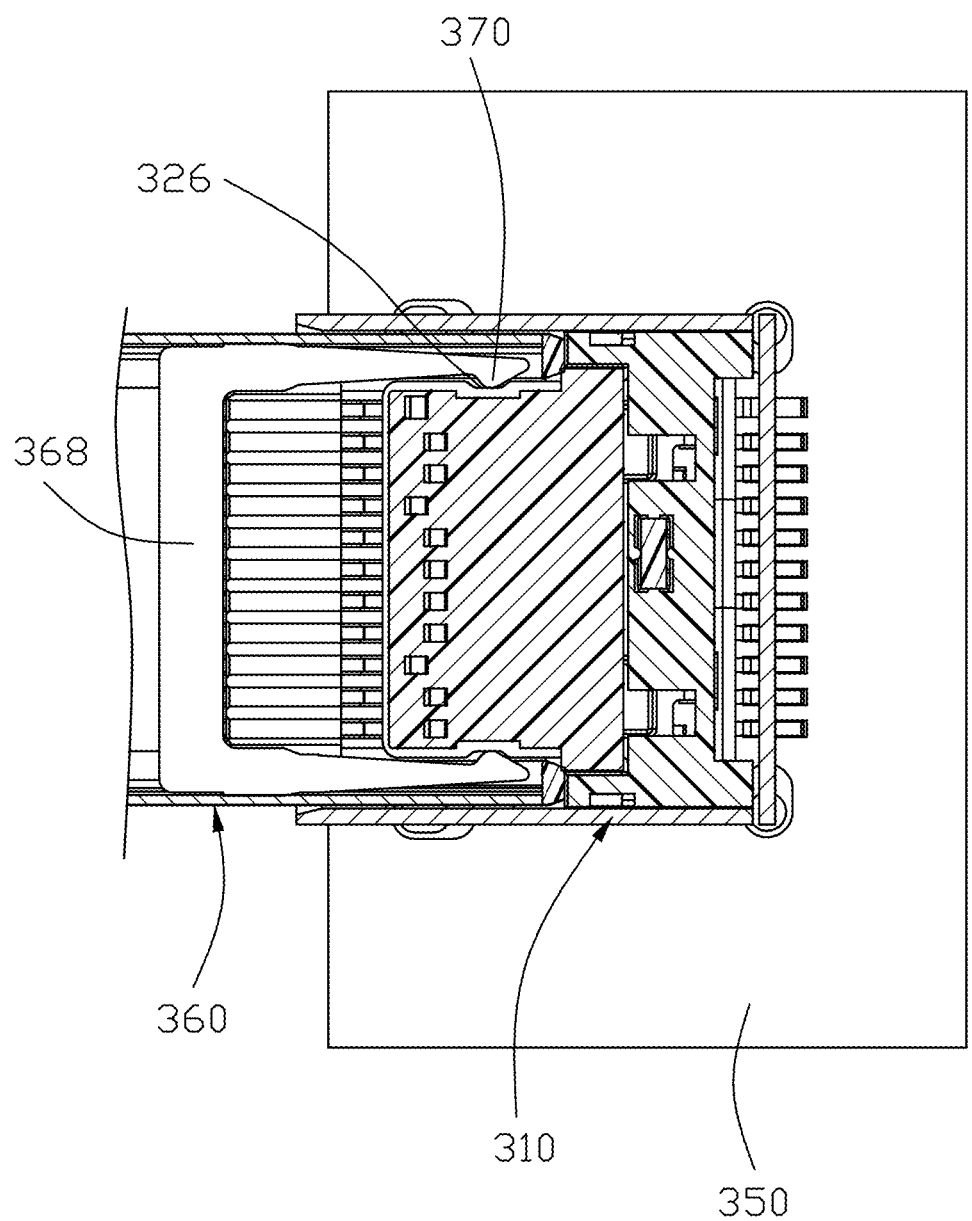
FIG. 22 is another cross-sectional view of the receptacle connector and the plug connector of FIG. 17 at a final stage of mating.
Figure 23:
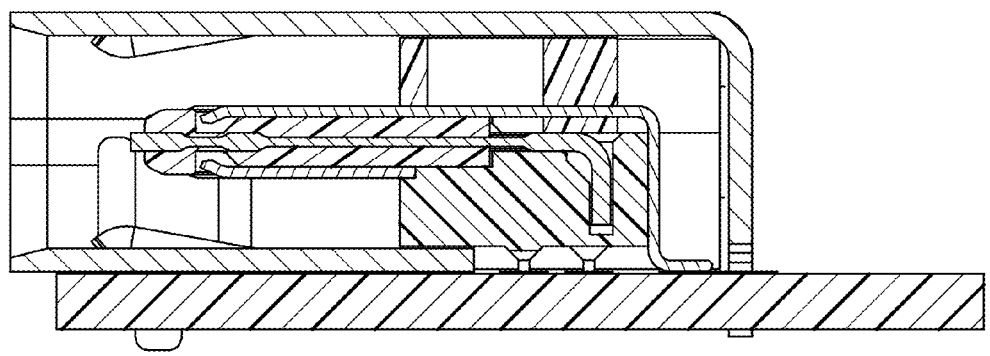
FIG. 23 is a cross-sectional view of the receptacle connector corresponding to FIG. 8(B) of the first embodiment, and is also derived from FIG. 17 of the parent application Ser. No. 14/497,205.

FIG. 17 shows the plug connector 360 is ready to be mated with the receptacle connector 310 with a distance therebetween. FIG. 18 shows the first stage where the locking heads 370 of the latch 368 may contact the front/side edge(s) of the shielding plate 322 to perform grounding. FIG. 19 shows the contacts 366 may intimately contact the front edge of the shielding plate 322 to perform another grounding at the second stage of mating. FIG. 20 shows the signal contacts 315 are not connected to the corresponding contacts 366 while the grounding/power contacts may contact the corresponding contacts 366 at the third stage of mating because the neighboring grounding/power contacts 315G/P are longer than the signal contacts 315 in the receptacle connector 310 that is also shown in all the previous embodiments. FIG. 21 shows the signal contacts connect to the corresponding contacts 366 of the plug connector 360 at the final stage of mating. FIG. 22 shows the cross-sectional view taken along the same horizontal plane with FIG. 17 to show the plug connector 360 is fully mated with the receptacle connector 310 wherein the locking heads 370 of the latch 368 of the plug connector 360 are engaged within the corresponding notches 326 of the shielding plate 322 of the receptacle connector 310. Understandably, the mating between the receptacle connector and the plug connector can be applied to all other embodiments of the instant invention, not only limited to this specific embodiment. In addition, FIG. 23 shows the cross-sectional view of the receptacle connector 10 of the first embodiment which is mounted upon the printed circuit board.

Figure 24A:
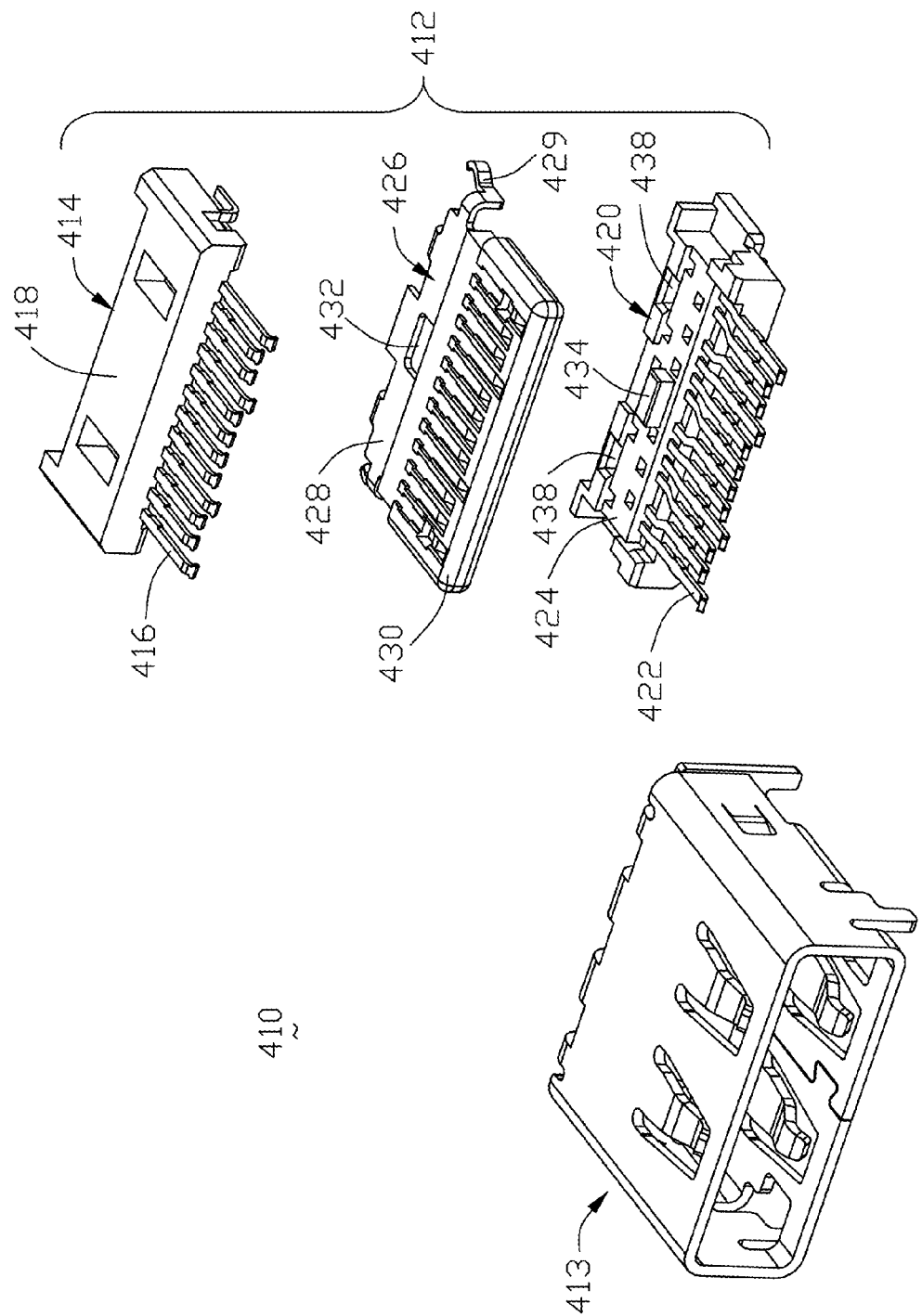
FIG. 24(A) is a front downward exploded perspective view of the receptacle connector of another embodiment of the invention, which is derived from FIG. 6(A) of the parent application Ser. No. 14/497,205.
Figure 24B:
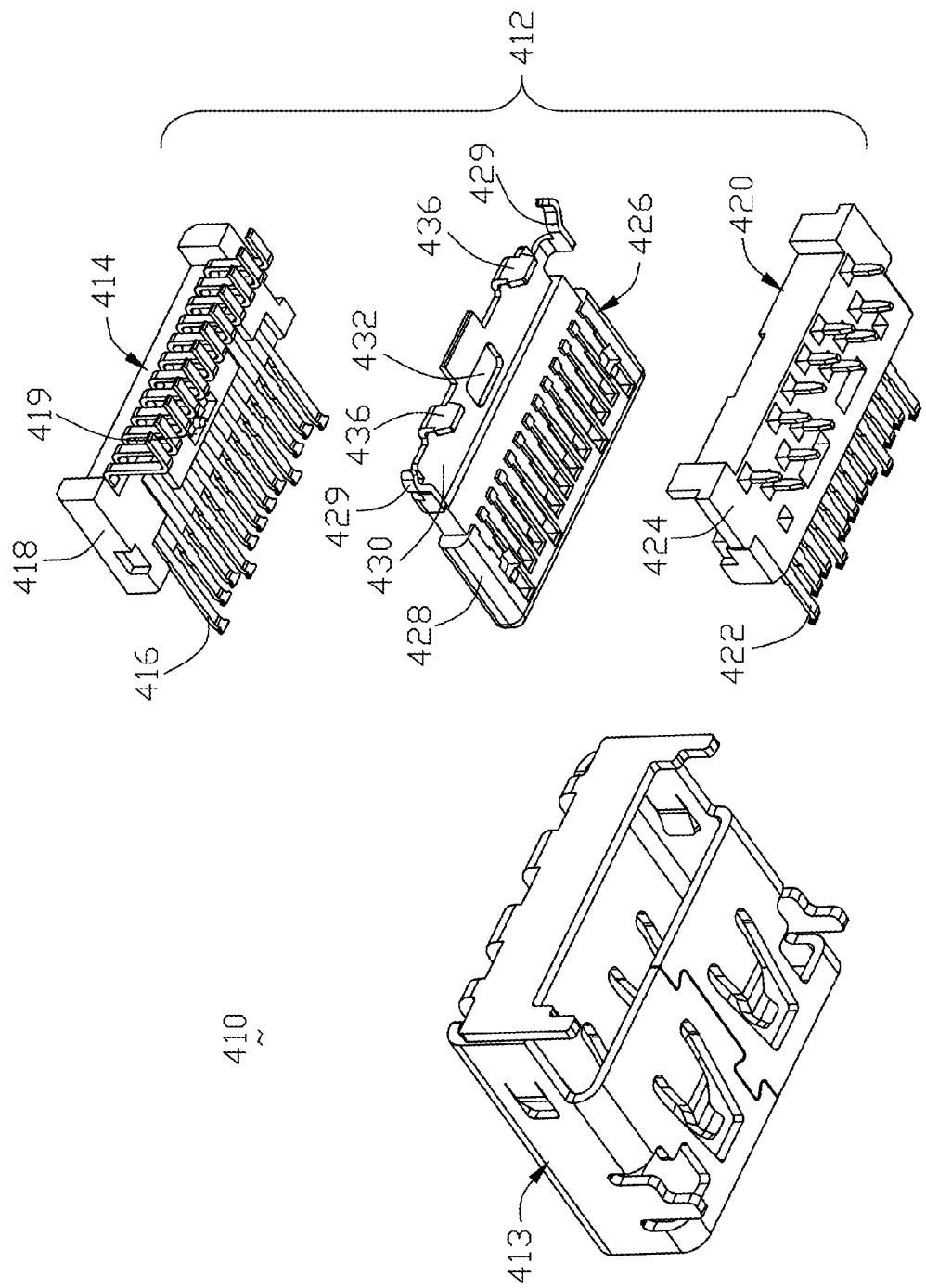
FIG. 24(B) is a rear upward exploded perspective view of the receptacle connector of FIG. 24(A), which is derived from FIG. 6(B) of the parent application Ser. No. 14/497,205.
Figure 25:
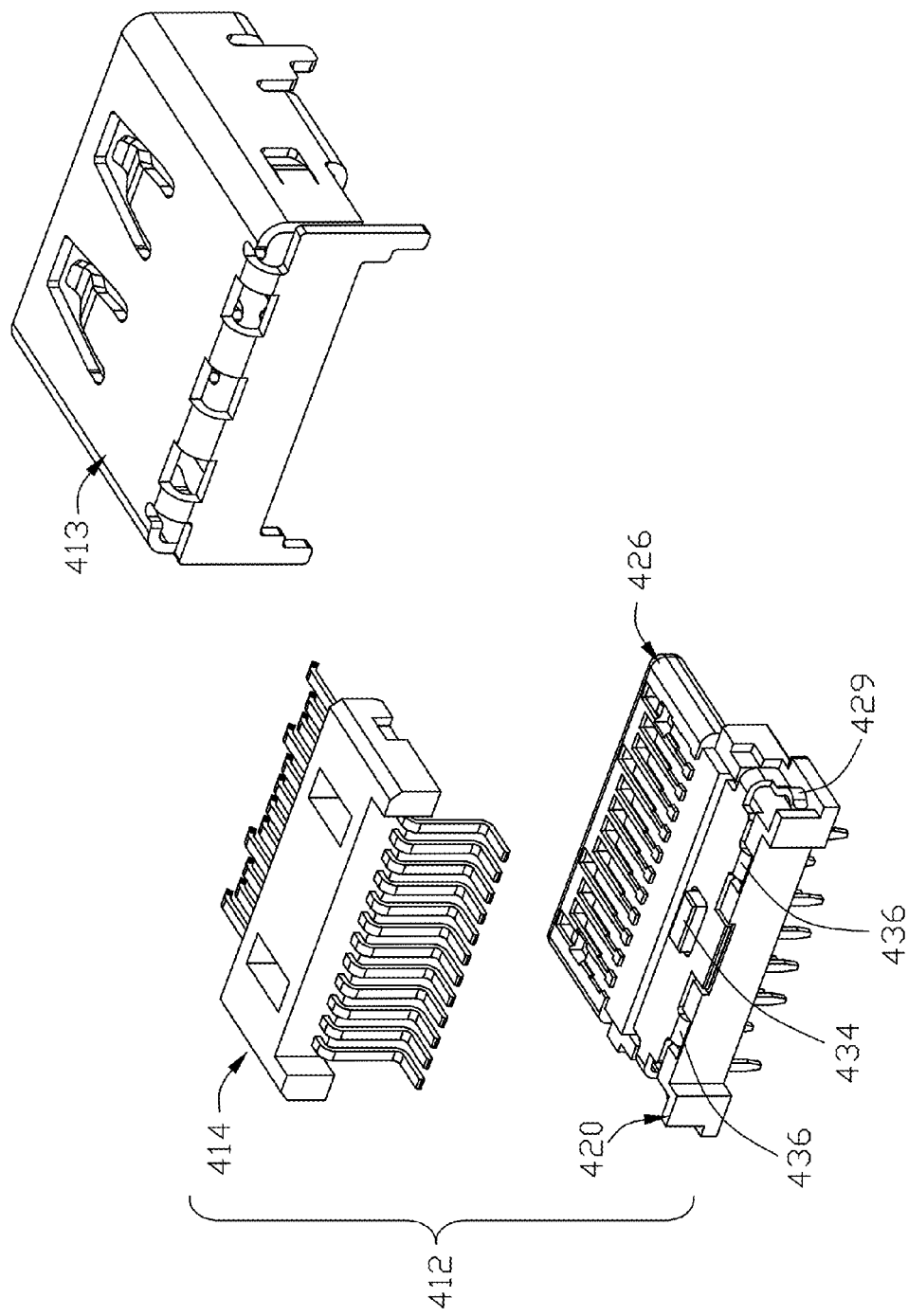
FIG. 25 is a perspective view of the receptacle connector with the partially assembled housing of the receptacle connector of FIG. 24(A), which is derived from FIG. 7 of the parent application Ser. No. 14/497,205.
Figure 26:
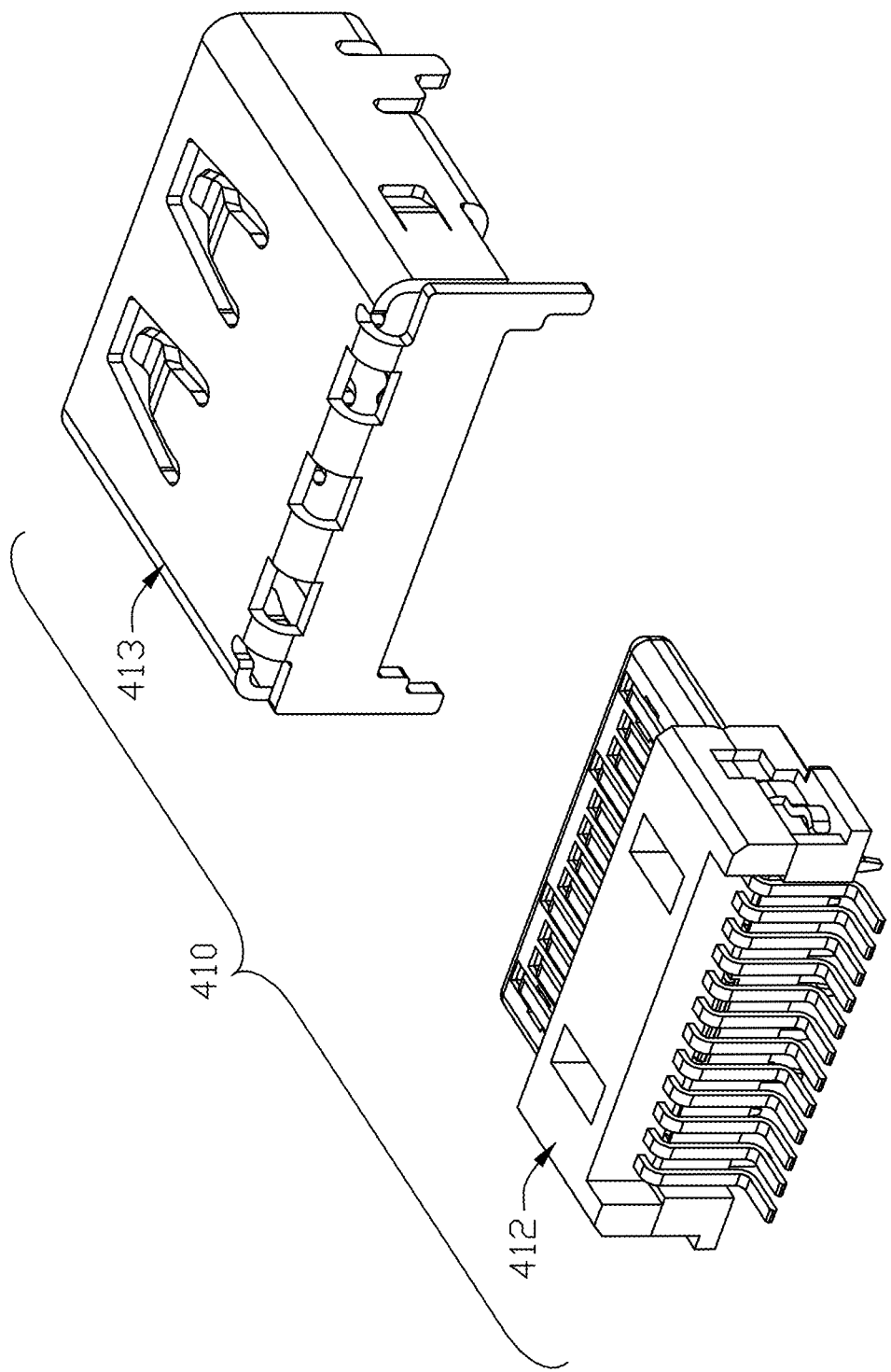
FIG. 26 is a perspective view of the receptacle connector with the further partially assembled housing of the receptacle connector of FIG. 25, which is derived from FIG. 8 of the parent application Ser. No. 14/497,205.
Figure 27:
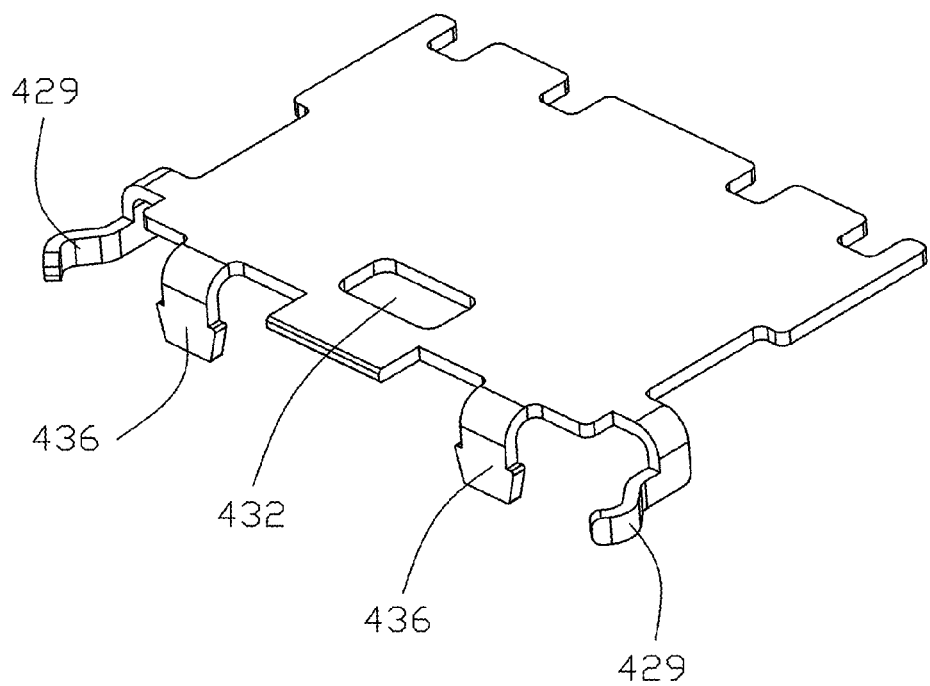
FIG. 27 is a perspective view of a shielding plate of the receptacle connector of FIG. 24(A), which is derived from FIG. 9 of the parent application Ser. No. 14/497,205.
Figure 28:
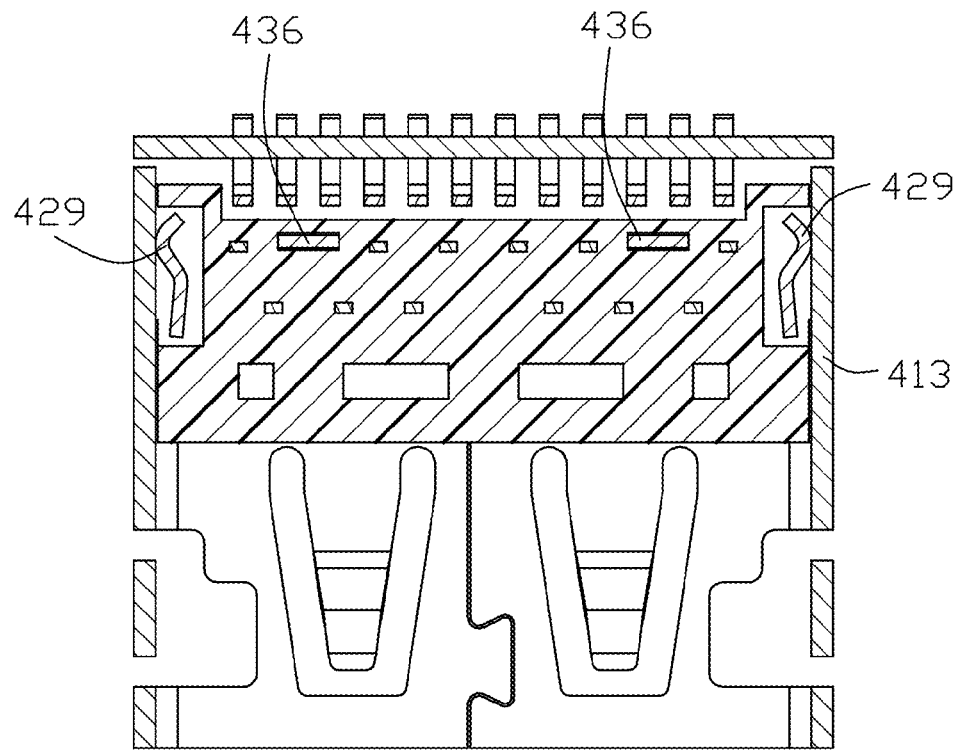
FIG. 28 is a cross-section view of the receptacle connector of FIG. 24(A) mounted on a printed circuit board, essentially showing an engagement of the spring tabs and the metallic shell, which is derived from FIG. 10 of the parent application Ser. No. 14/497,205.
Figure 29:
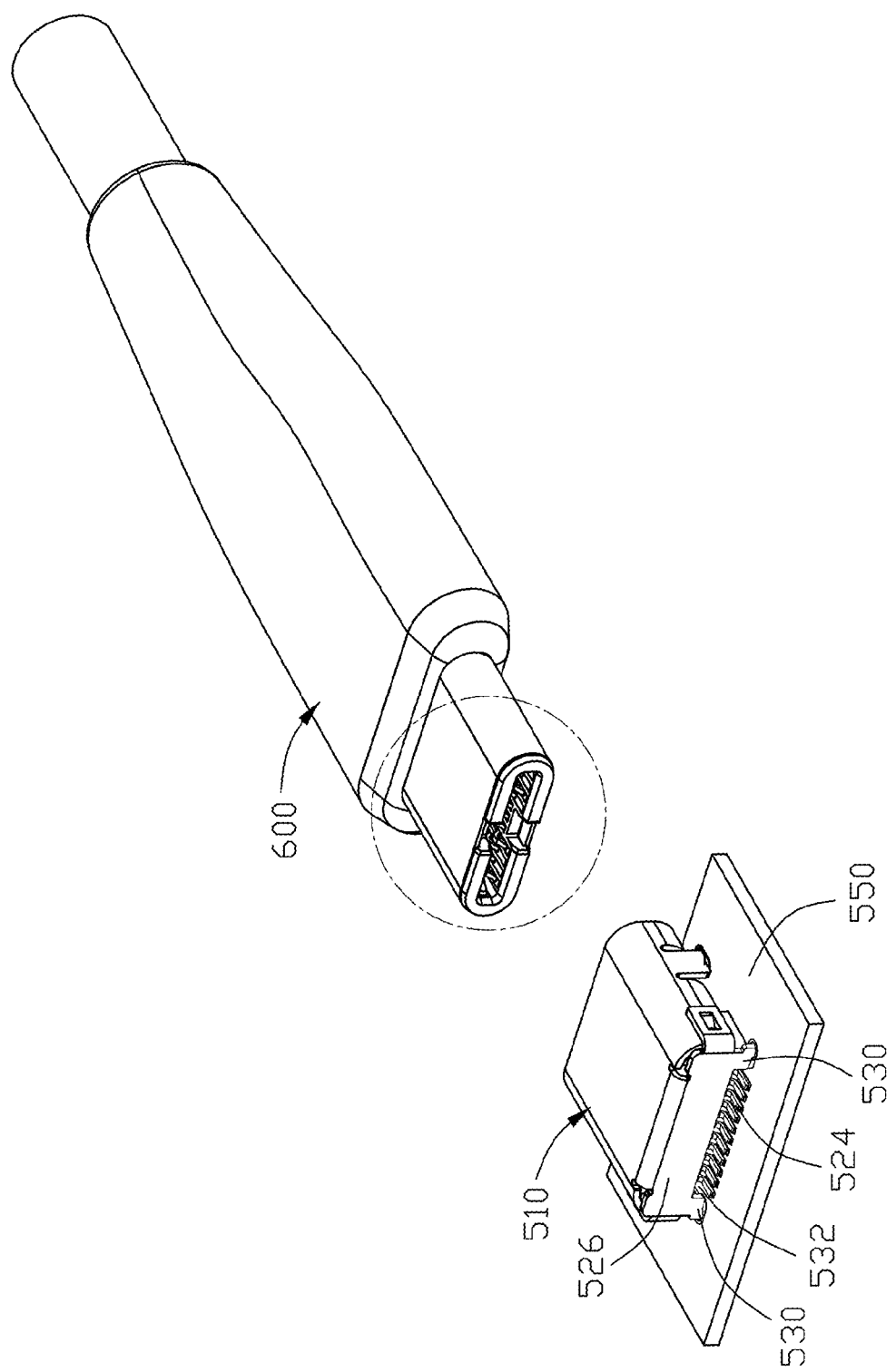
FIG. 29 is an exploded perspective view of the receptacle connector mounted upon a printed circuit board and the corresponding plug connector of another embodiment of the invention.
Figure 30:
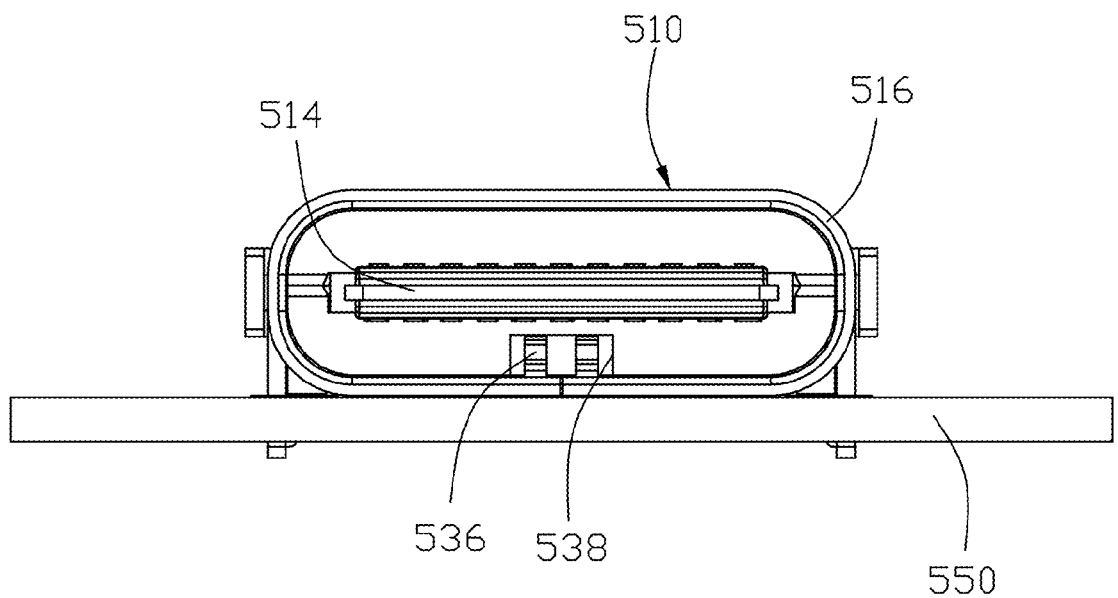
FIG. 30 is a front elevational view of the receptacle connector on the printed circuit board of FIG. 23.
Figure 31:
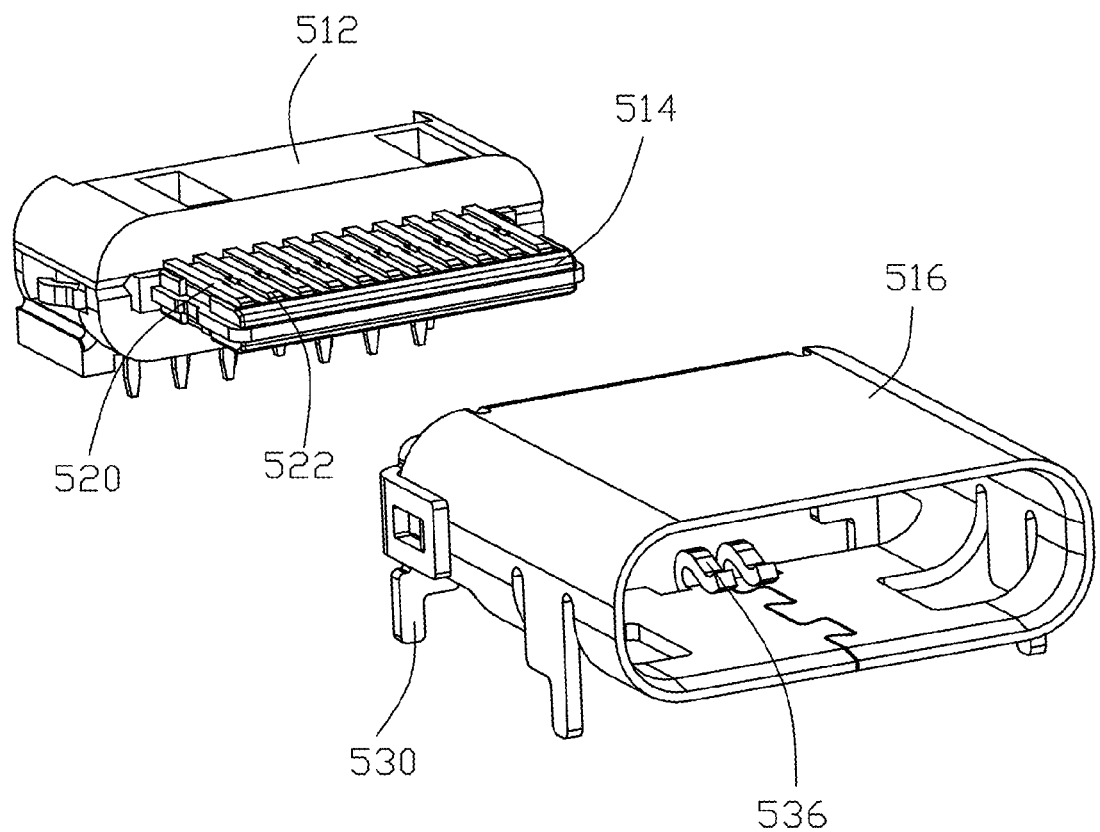
FIG. 31 is an exploded perspective view of the receptacle connector of FIG. 24.
Figure 32:
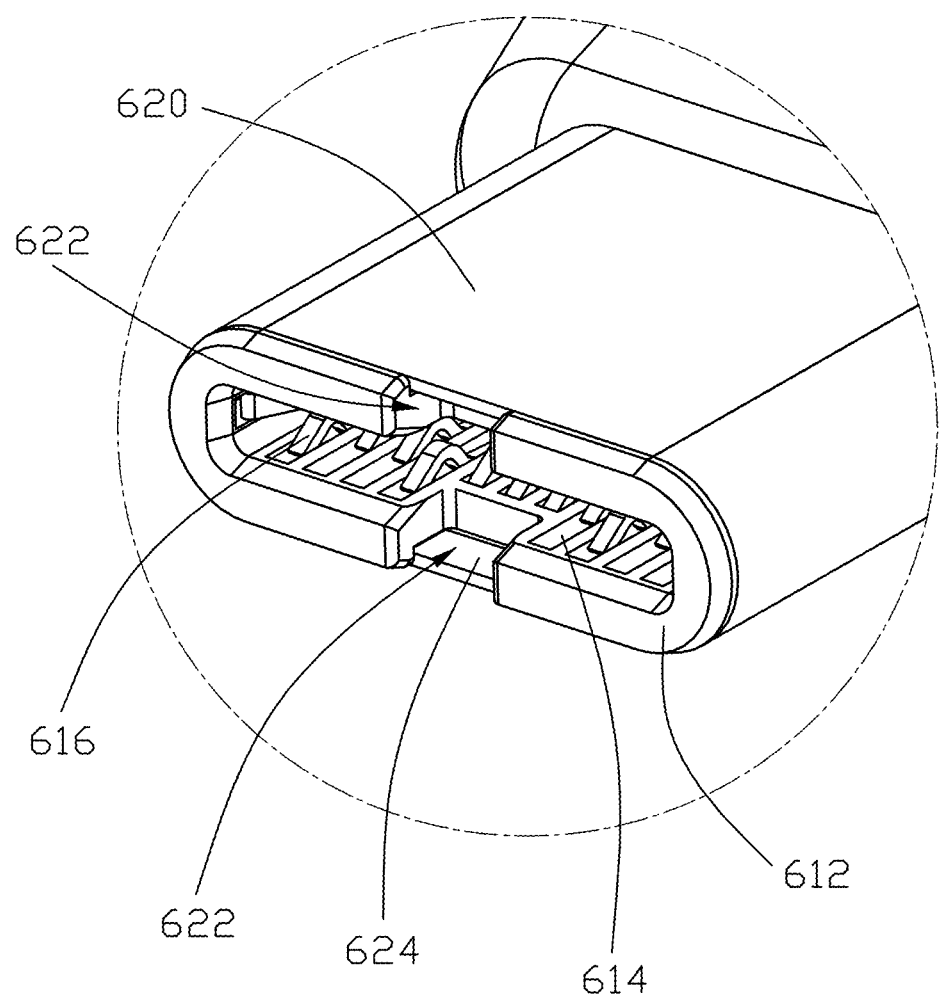
FIG. 32 is a partial enlarged perspective view of the plug connector of FIG. 23.
Figure 33:
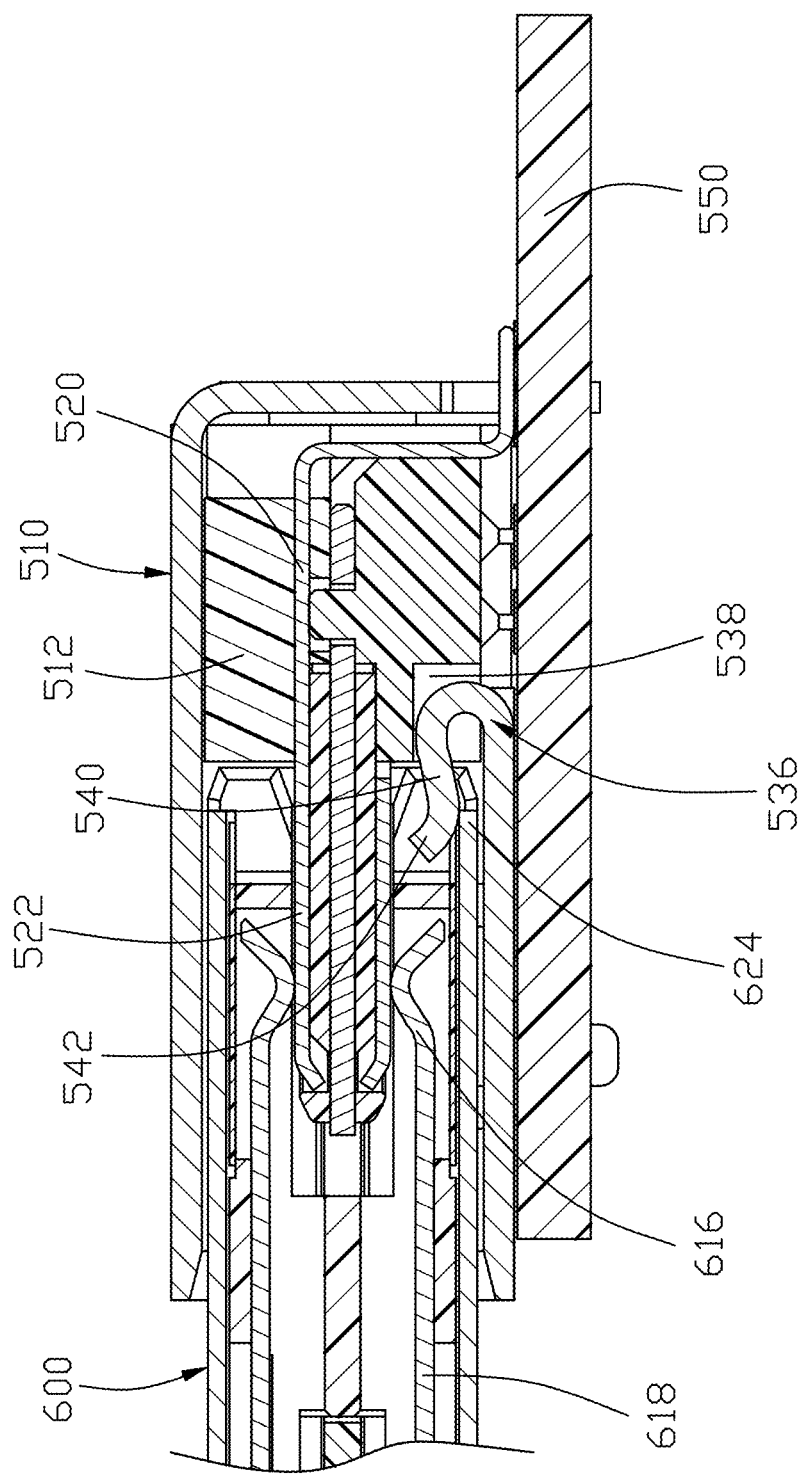
FIG. 33 is a cross-sectional view of the receptacle connector and the plug connector of FIG. 24 during mating.

FIG. 24 (A)-28 show another embodiment of the receptacle connector 410, having a basic structure similar to the first embodiment including a terminal assembly 412 enclosed within a metallic shield 413. The terminal assembly 412 includes an upper terminal module 414 with a plurality of upper terminal 416 embedded within the upper insulator 418 via an insert-molding process, a lower terminal module 420 with a plurality of lower terminals 422 embedded within the lower insulator 424 via an insert-molding process to cooperate with the upper terminal module 414 to sandwich therebetween in a vertical direction a shielding plate module 426 having a metallic shielding plate 428 embedded within a middle insulator 430 via another insert-molding process.

Similar to the first embodiment, in this embodiment the shielding plate 428 forms an opening 432 to receive an upward protrusion 434 of the lower insulator 424. It is further noted that the underside of the upper insulator 418 forms a recess 419 to further receive the tip of the upward protrusion 434 of the lower insulator 424. Also, the shielding plate 428 has a pair of lances 436 to be received within the corresponding holes 438 of the lower insulator 424. The shielding plate 428 further includes a pair of spring tabs 429 to electrically and mechanically connect to the shield 413. Understandably, this embodiment shares the same basic "sandwiched type" structures with the first embodiment, i.e., the upper terminal module cooperating with the lower terminal module to sandwich the shielding plate module with means for aligning and combining the lower terminal module, the shielding plate module and the upper terminal module together and means for contacting the shielding plate with the shield of the receptacle connector.

FIGS. 29-33 show another embodiment of the receptacle connector which is essentially similar to the previous embodiments while being further optionally equipped with the clip structure around the rear edge of the shield thereof, and the corresponding plug connector further optionally forms a pair of recesses to expose the corresponding portions of the shell thereof for coupling to the clip structure during mating. The details are illustrated below.

The receptacle connector 510 mounted upon a printed circuit board 550, which includes an insulative housing 512 with a forwardly extending mating tongue 514 therewith, and a metallic shield 516 enclosing the housing 512 to define a receiving cavity 518 in which the mating tongue 514 is disposed. A plurality of contacts 520 with contacting portions 522 exposed on opposite surfaces of the mating tongue 514.

The metallic shield 516 of then receptacle connector 510 includes a rear cover 526. The shield 516 includes a locking structure to lock a locking tab 528 of the rear cover 526 to secure the rear cover 526 to the side wall of the shell 516. The rear cover 526 includes a pair of mounting legs 530 being soldered to the printed circuit board 550. In this embodiment, the rear cover 526 intimately contacts the rear side of the insulative housing 512 so as to efficiently stop the rearward movement of the housing 512 when the housing 512 is urged rearwardly by the inserted plug connector 600 during mating. Because of the mounting legs 530, the rearward force imposed upon the rear cover 526 may be transferred to the printed circuit board 550. On the other hand, understandably the rear lower edge of the capsular configuration of the shell 516 stops the forward movement of the housing 512 so as to cooperate with the rear cover 526 for retaining the shell 516 with regard to the housing 512 in the front-to-back direction. In this embodiment, the rear cover 526 defines a cutout 532 between the pair of mounting legs 530 to allow the horizontal mounting tails 524 of the contacts 520 to rearwardly extend beyond the rear cover 526. Alternately, for enhancing the shielding effect, the tails 524 may be arranged in a through hole type so as to have the rear cover 526 be a complete piece without such a cutout 532.

The metallic shell 516 of the receptacle connector 510 forms a clip structure 536 by folding an extension on a rear lower edge of the capsular configuration of the shell 516. The clip structure 536 is partially received in a recession 538 of the insulative housing 512 enclosed in the shell 516. In this embodiment, the clip structure 536 is of two parallel elastic arms type discrete from each other. Each elastic arm has a facing-downward arc portion 540 and a front slant-upwards portion 542 continued from the arc portion 540.

Correspondingly, a plug connector 600 is included, which includes an insulative housing 612 defining a receiving cavity 614, contacting sections 616 of contacts 618 disposed on opposite inside surfaces of the mating cavity 614 and a metallic shell 620 snugly attached on an outer periphery of the insulating housing. The insulative housing 612 defines a pair of recesses 622 in a front end to expose the shell 620 therein, i.e., exposed shell portions 624, so that during mating, the shell 620 of the plug connector 600 in the recess 622 is sandwiched by the clip structure 536 of the receptacle connector 510 in either orientation of the plug connector 600 with regard to the receptacle connector 510. This internal type sandwiching engagement between the shell 620 of the plug connector 600 and the shell 516 of the receptacle connector 510 enhances both the mechanical and electrical connection between the plug connector 600 and the receptacle connector 510.

Figure 34:
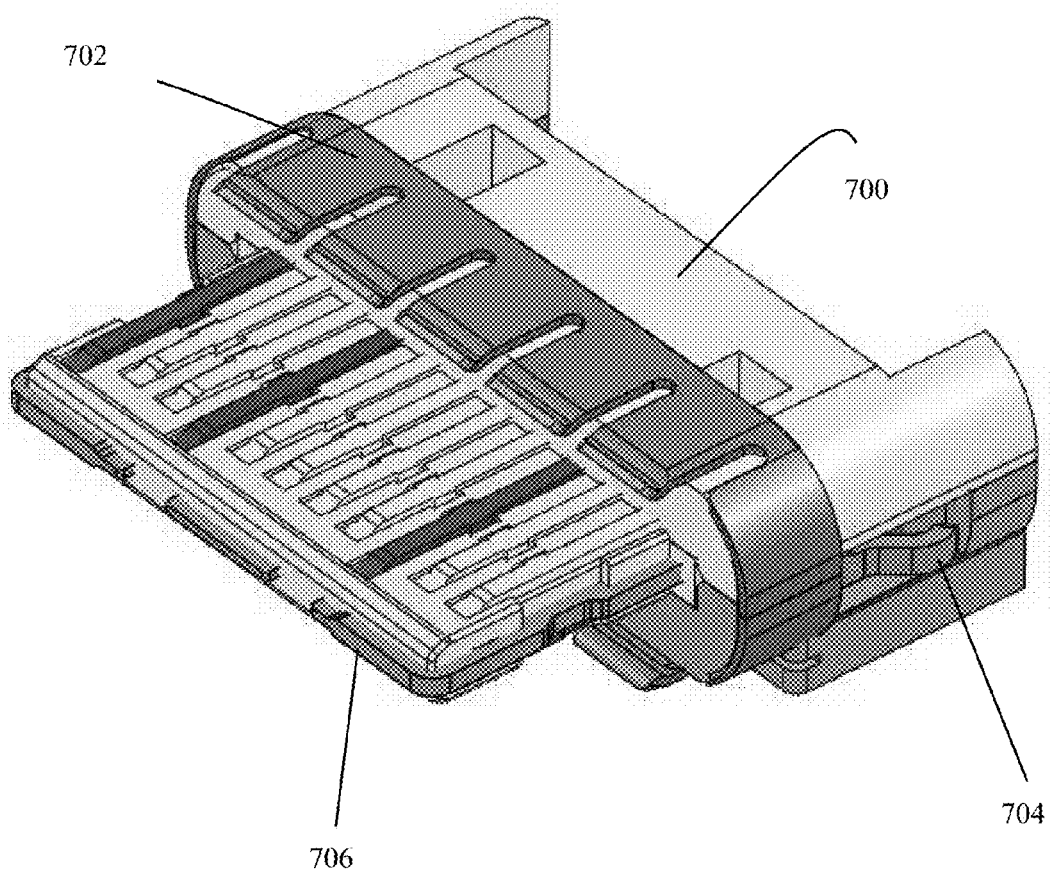
FIG. 34 a front assembled perspective view of the terminal assembly of the receptacle connector according to another embodiment of the invention which is derived from the provisional application 61/927,951.
Figure 35:
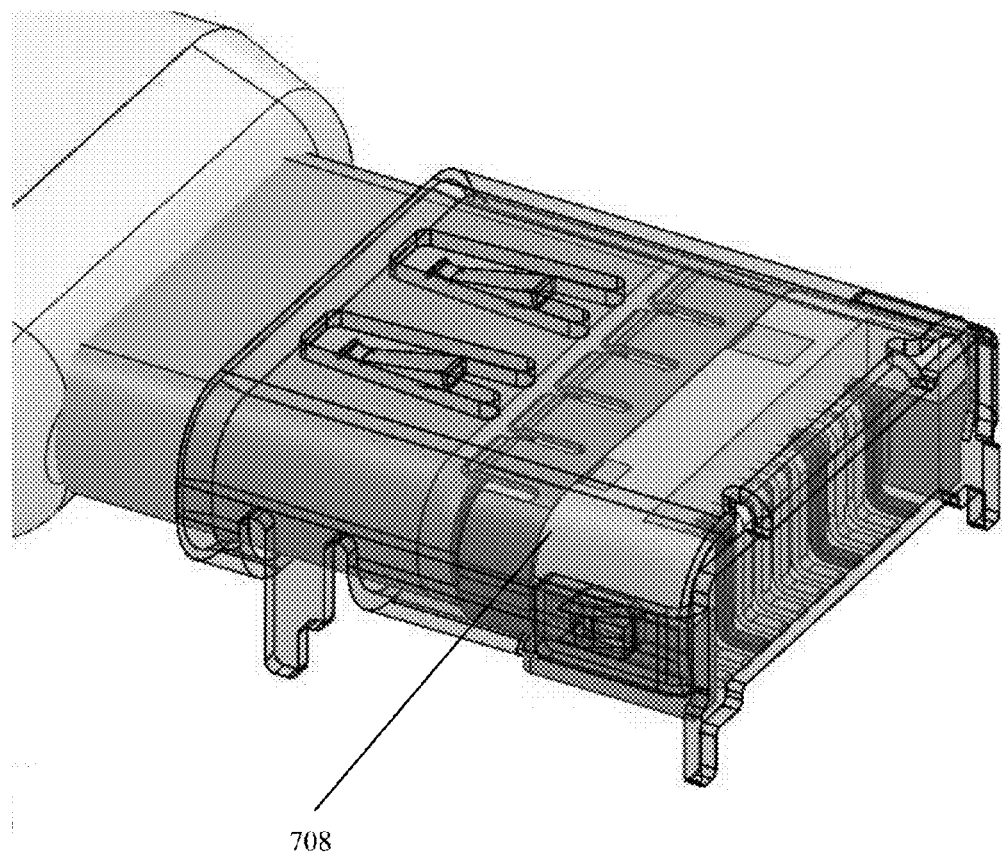
FIG. 35 is an assembled perspective view of the receptacle connector of FIG. 34 and the corresponding plug connector wherein the shield of the receptacle is shown in a transparent manner.

FIGS. 34-35 show another embodiment of the receptacle connector wherein the only difference is that the terminal assembly 700 is further equipped with a metallic collar 702 around a rear side of the mating tongue for contacting the front edge region of the shell of the corresponding plug connector during mating. Notably, similar to the previous embodiment, the spring tangs 704 of the shielding plate 706 are mechanically and electrically connected to the shield of the receptacle connector once assembled. Therefore, the shielding plate 706 and the metallic collar 702 can be electrically connected via the shield of the receptacle connector 708 and the shell of the plug connector during mating.

Figure 36:
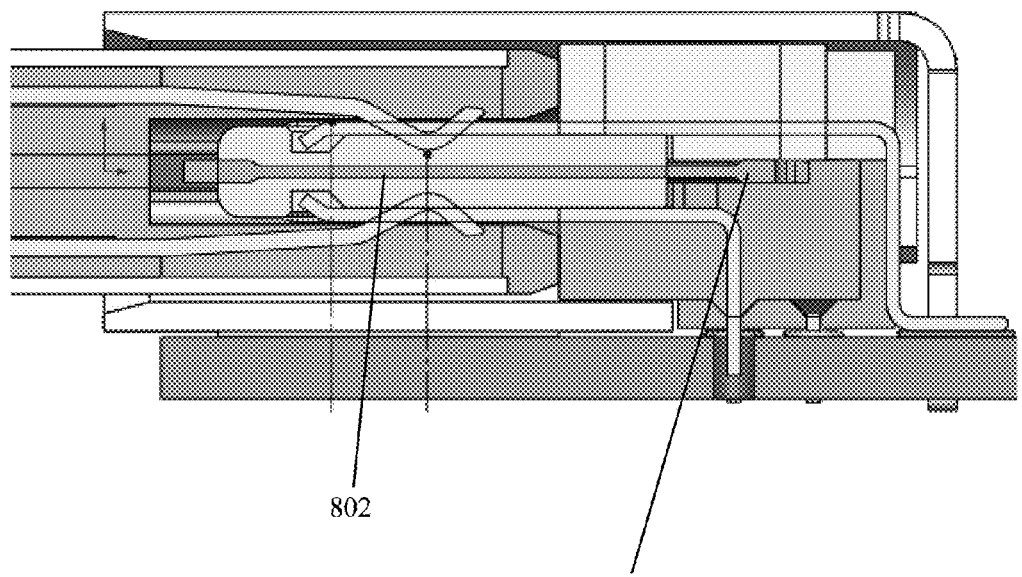
FIG. 36 is a cross-sectional view of the receptacle connector of another embodiment similar to what is disclosed in FIGS. 14(A) and 14(B), and the corresponding plug connector, which is derived from the provisional application 61/919,681.
Figure 37:
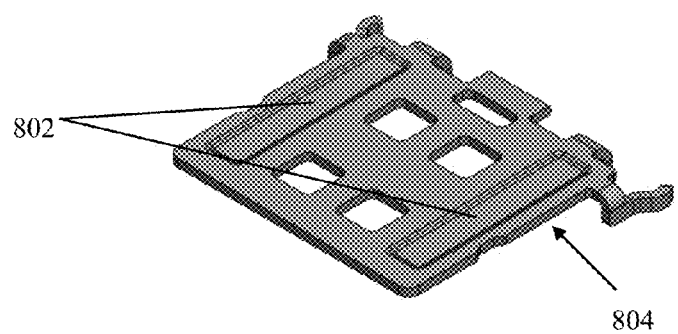
FIG. 37 is a front perspective view of the shielding plate of FIG. 34.

FIGS. 36-37 show another embodiment of the receptacle connector which similarly discloses the thinned area 802 on the shielding plate 804 similar to the thinned area 45 of the shielding plate 28 in the first embodiment for SS impedance control.

Figure 38:
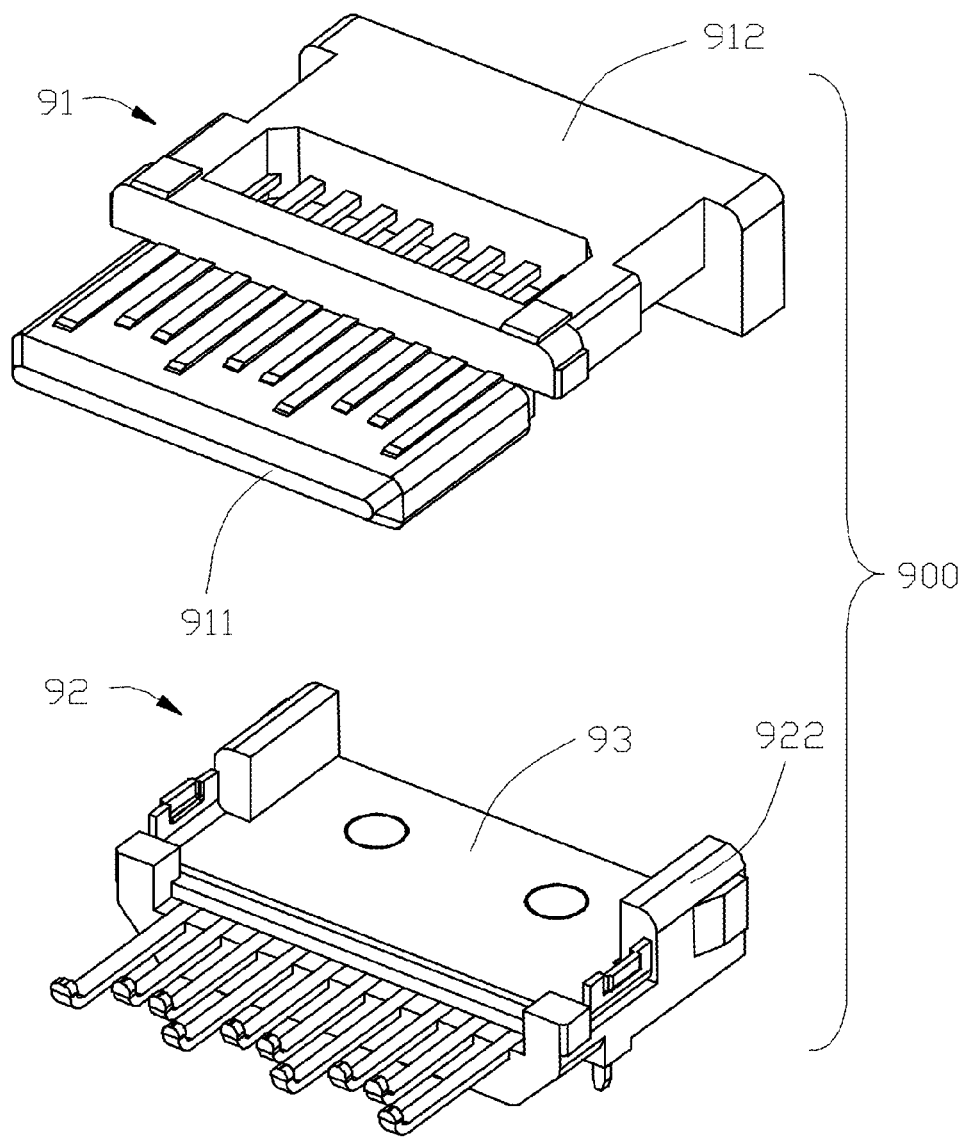
FIG. 38 is a front exploded perspective view of a receptacle connector of another embodiment.

FIG. 38 shown an another embodiment of a receptacle connector 900, which includes an upper terminal module 91, a lower terminal module 92 and a shielding plate 93 sandwiched between the upper and lower terminal module. The shielding plate 93 is disposed between the base 912, 922 of the upper and lower terminal module, not extending to the mating tongue 911 which is formed on the upper terminal module.

However, the disclosure is illustrative only, changes may be made in detail, especially in matter of shape, size, and arrangement of parts within the principles of the invention. Understandably, as mentioned before, the spirit of the invention throughout all embodiments is to provide the sandwiched type terminal assembly, i.e., the upper terminal module and the lower terminal module commonly sandwiching the shielding plate module which may include the shielding plate only or further with the insert-molded insulator, wherein the front edge and the lateral edges of the shielding plate are exposed to an exterior and optionally equipped with notches for locking. On the other hand, because all the embodiment essentially share the similar structures, some specific structures not clearly shown in one embodiment may be clearly shown in other embodiments for examination purpose.

What is claimed is:

1. An electrical connector comprising:
a metallic shield forming a mating cavity;
a terminal assembly disposed within the shield and forming a mating tongue extending into the mating cavity;
said terminal assembly including:
an upper terminal module with a plurality of upper contacts embedded within an upper insulator via a first insert-molding process;
a lower terminal module with a plurality of lower contacts embedded within a lower insulator via a second insert-molding process; and
a shielding plate module including at least one metallic shielding plate located between the upper terminal module and the lower terminal module in a vertical direction; wherein
the shielding plate defines a pair of locking notches in two opposite lateral side, respectively, in a transverse direction perpendicular to said vertical direction for latching with a latch of a complementary plug connector; wherein
in a top view along said vertical direction, an insulative portion of the mating tongue defines a pair of recesses in two opposite lateral sides adjacent to and configurationally in compliance with the corresponding pair of notches in said transverse direction, respectively, and each of said recesses is recessed inwardly in said transverse direction from remaining portions of the corresponding lateral side in said top view.

2. The electrical connector as claimed in claim 1, wherein said mating tongue is formed essentially solely, except contacting sections of the upper terminals and those of the lower terminals, by said shielding plate module which includes said shielding plate embedded within a middle insulator via a third insert-molding process.

3. The electrical connector as claimed in claim 1, wherein said shielding plate module only includes said shielding plate, and said mating tongue is formed, except the contacting sections of the upper terminals and those of the lower terminals, by the upper insulator and the lower insulator with the shielding plate therebetween.

4. The electrical connector as claimed in claim 1, wherein one of the upper insulator and the lower insulator forms a protrusion extending through the shielding plate module to enter the other so as to align the upper terminal module, the shielding plate module and the lower terminal module together in the vertical direction.

5. The electrical connector as claimed in claim 1, wherein the shielding plate forms opposite front confrontation edge and rear confrontation edge in a front-to-back direction perpendicular to both said vertical direction and said transverse direction so as to be engaged with an insulator which is insert-molded thereon for restricting movement of the shielding plate relative to said insulator in the front-to-back direction.

6. The electrical connector as claimed in claim 1, wherein said shielding plate forms a thinned area, and said confrontation edges are formed on a boundary of said thinned area.

7. The electrical connector as claimed in claim 6, wherein contacting sections of the contacts are exposed upon a surface of the mating tongue, and front ends of the contacting sections are inwardly deflected around the thinned area for forming lead-in structures to mate with the complementary plug connector.

8. The electrical connector as claimed in claim 1, wherein said shielding plate forms an empty area, and said confrontation edges are formed on a boundary of said empty area.

9. The electrical connector as claimed in claim 8, wherein contacting sections of the contacts are exposed upon a surface of the mating tongue, and front ends of the contacting sections are inwardly deflected around the empty area for forming lead-in structures to mate with the complementary plug connector.

10. The electrical connector as claimed in claim 1, wherein said shielding plate forms a cutout aligned with a power contact of said contacts so as to avoid shorting during mating with the complementary connector.

11. The electrical connector as claimed in claim 1, wherein said shielding plate includes a pair of spring tabs to mechanically and electrically connect to the shield.

12. An electrical connector assembly comprising:
a first connector including:
a first terminal assembly enclosed within a first metallic shield, said first terminal assembly having a plurality of first contacts disposed within a first insulative housing, said first insulative housing forming a mating tongue on which contacting sections of the first contacts are exposed, said shield defining a mating cavity in which the mating tongue forwardly extends;
a metallic shielding plate embedded within the mating tongue and defining two opposite locking notches in two opposite lateral sides;
a second connector including:
a second insulative housing enclosed within a metallic shell for being received within the mating cavity and defining a receiving cavity for receiving the mating tongue of the first connector;
a plurality of second contacts disposed in the second insulative housing;
a metallic latch disposed in the second insulative housing with two locking heads extending into the receiving cavity on two lateral sides; wherein
said latch is configured and dimensioned to confront opposite two front corners of the shielding plate before the first contacts and the second contacts are confronted with each other at an initial stage of mating, and is successively retained respectively within the corresponding notches of the shielding plate at a final stage of mating.

13. The electrical connector assembly as claimed in claim 12, wherein said first terminal assembly includes an upper terminal module essentially with a plurality of upper contacts embedded within an upper insulator via a first insert-molding process, a lower terminal module essentially with a plurality of lower contacts embedded within a lower insulator via a second insert-molding process, said upper terminal module cooperating with said lower terminal module to commonly sandwich a shielding plate module therebetween in a vertical direction; wherein said shielding plate module includes at least said shielding plate.

14. The electrical connector assembly as claimed in claim 13, wherein said shielding plate module further includes a middle insulator enclosing said shielding plate via a third insert-molding process.

15. The electrical connector assembly as claimed in claim 12, wherein said mating tongue forms in two opposite lateral sides a pair of recesses aligned with and intimately located inside of said pair of notches in a transverse direction.

16. An electrical connector assembly comprising:
a first connector comprising:
a first insulative housing defining a forwardly extending mating tongue;
a plurality of first contacts disposed in the first insulative housing with first contacting sections exposed upon the mating tongue;
a metallic shield enclosing the first insulative housing to define a mating cavity in which said mating tongue is disposed;
the metallic shield defining a clip structure by folding an extension on a rear lower edge of the metallic shell; and
a second connector intending to mate with the first electrical connector, the second electrical connector comprising:
a second insulative housing defining a receiving cavity to receive the mating tongue;
a plurality of second contacts disposed in the second insulative housing with second contacting sections exposed in the receiving cavity;
a metallic shell snugly attached on an outer periphery of the second insulating housing;
wherein the second insulative housing of the second electrical connector defines a recess in a front end to expose the metallic shell of the second connector therein so that during mating, the metallic shell of the second connector in the recess is sandwiched by the clip structure of the first electrical connector.

17. The electrical connector assembly as claimed in claim 16, wherein the second insulative housing of the second electrical connector defines said recess on each side of the receiving cavity so that during mating, the metallic shell of the second connector in the recess is sandwiched by the clip structure of the first electrical connector in either orientation of the second electrical connector with regard to the first electrical connector.

18. The electrical connector assembly as claimed in claim 16, wherein the clip structure is of two parallel elastic arms type discrete from each other.

19. The electrical connector assembly as claimed in claim 18, wherein each elastic arm has a facing-downward arc portion and a front slant-upwards portion continued from the arc portion.

20. An electrical connector comprising:
a metallic shield forming a mating cavity;
a terminal assembly disposed within the shield and forming a mating tongue extending into the mating cavity;
said terminal assembly including:
an upper terminal module with a plurality of upper contacts embedded within an upper insulator via a first insert-molding process;
a lower terminal module with a plurality of lower contacts embedded within a lower insulator via a second insert-molding process; and
a shielding plate module including at least one metallic shielding plate located between the upper terminal module and the lower terminal module in a vertical direction; wherein
the shielding plate defines a pair of locking notches in two opposite lateral side, respectively, in a transverse direction perpendicular to said vertical direction for latching with a latch of a complementary plug connector; wherein
said shielding plate forms a cutout aligned with a power contact of said contacts so as to avoid shorting during mating with the complementary connector.

* * * * *